United States Patent [19]
Otani et al.

[11] Patent Number: 5,460,653
[45] Date of Patent: Oct. 24, 1995

[54] SPRAY TYPE FLUX APPLYING DEVICE

[75] Inventors: Hiroshi Otani; Naotoshi Fukushima, both of Tokyo; Yoshihisa Yamazaki, Shizuoka, all of Japan

[73] Assignee: NEC Corporation, Japan

[21] Appl. No.: 161,693

[22] Filed: Dec. 3, 1993

Related U.S. Application Data

[63] Continuation of Ser. No. 722,016, Jun. 27, 1991, abandoned.

[30] Foreign Application Priority Data

| Jun. 28, 1990 | [JP] | Japan | 2-170952 |
| Jun. 28, 1990 | [JP] | Japan | 2-170953 |
| Jun. 28, 1990 | [JP] | Japan | 2-170954 |
| Jun. 12, 1991 | [JP] | Japan | 3-140256 |

[51] Int. Cl.$^6$ .............. B05B 13/04; B05B 3/00; B05C 11/00
[52] U.S. Cl. .............. 118/668; 118/680; 118/696; 118/705; 118/712; 118/323; 118/324; 222/55; 222/399; 239/69; 239/415
[58] Field of Search ............... 118/668, 679, 118/680, 692, 696, 703, 705, 712, 303, 323, 324; 222/55, 396, 399, 401; 239/69, 412, 413, 415, 528, 599

[56] References Cited

U.S. PATENT DOCUMENTS

| 3,593,308 | 7/1971 | Fagan | 118/679 |
| 3,646,521 | 2/1972 | Porter | 118/679 |
| 3,796,184 | 3/1974 | Hawkins . | |
| 3,827,309 | 8/1974 | Dooley | 118/323 |
| 4,421,800 | 12/1983 | Schoenberg | 118/680 |
| 4,593,360 | 6/1986 | Cochs | 239/69 |
| 4,759,502 | 7/1988 | Pomponi, Jr. et al. | 239/528 |
| 4,844,342 | 7/1989 | Foley | 239/415 |
| 5,020,473 | 6/1991 | Bergman | 118/669 |

FOREIGN PATENT DOCUMENTS

| 2924264 | 12/1980 | Germany | 118/679 |
| 0611644 | 5/1946 | United Kingdom . | |
| 0915199 | 8/1959 | United Kingdom . | |

*Primary Examiner*—W. Gary Jones
*Assistant Examiner*—Steven P. Griffin
*Attorney, Agent, or Firm*—Ostrolenk, Faber, Gerb & Soffen

[57] ABSTRACT

A device for applying flux to the rear of a printed circuit board loaded with electronic parts on the front thereof and being transported by spraying the flux. The device has a single nozzle which is movable in a reciprocating motion in a direction perpendicular to the moving direction of the circuit board, thereby applying flux to the entire rear surface of the circuit board in a uniform distribution. The range of reciprocation of the nozzle is controlled on the basis of data generated by a sensor which is responsive to the width of the circuit board in transport. A flux feeding device capable of adjusting the amount of flux to be sprayed from the nozzle and a device for preventing the nozzle from being stopped up are associated with the flux applying device.

19 Claims, 17 Drawing Sheets

FIG. 4
PRIOR ART
FIG. 4A
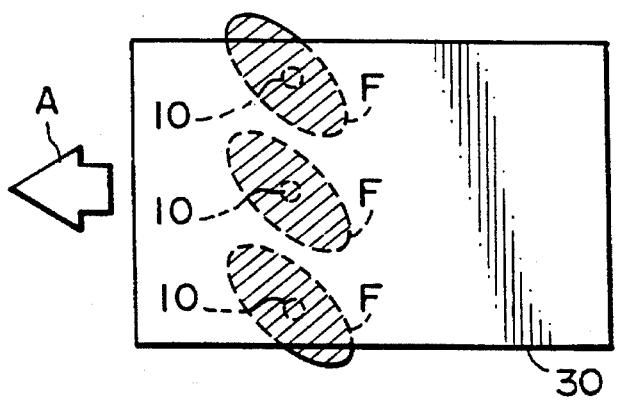
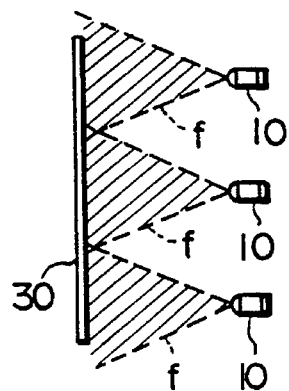
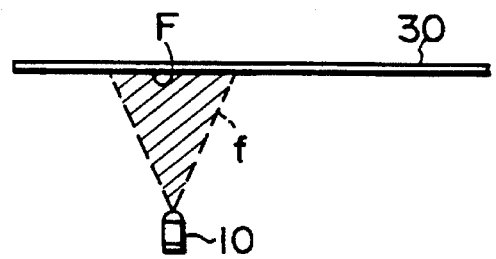
FIG. 4B
FIG. 5
PRIOR ART
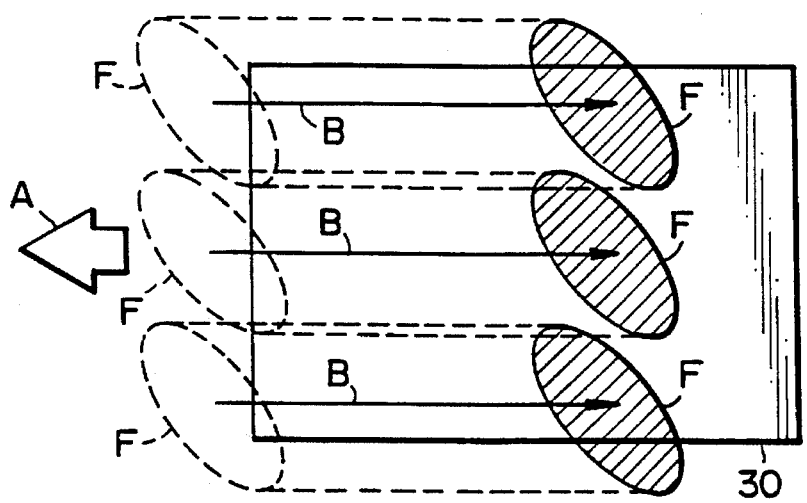

FIG. 6 PRIOR ART
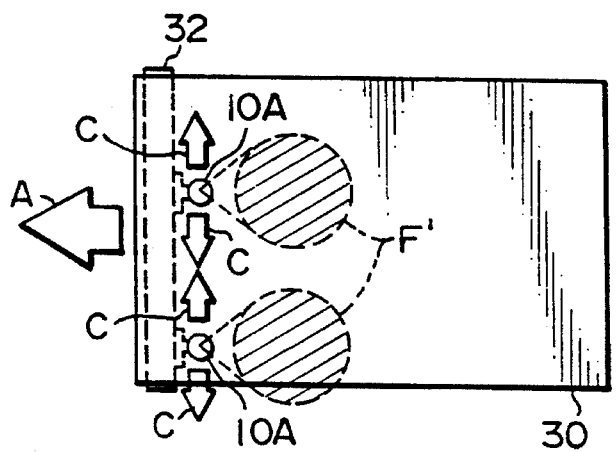
FIG. 6A
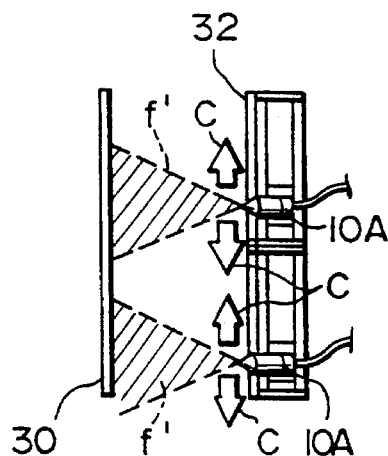
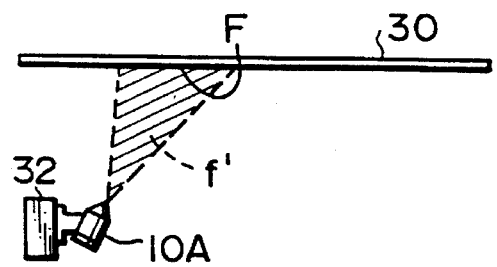
FIG. 6B
FIG. 7 PRIOR ART
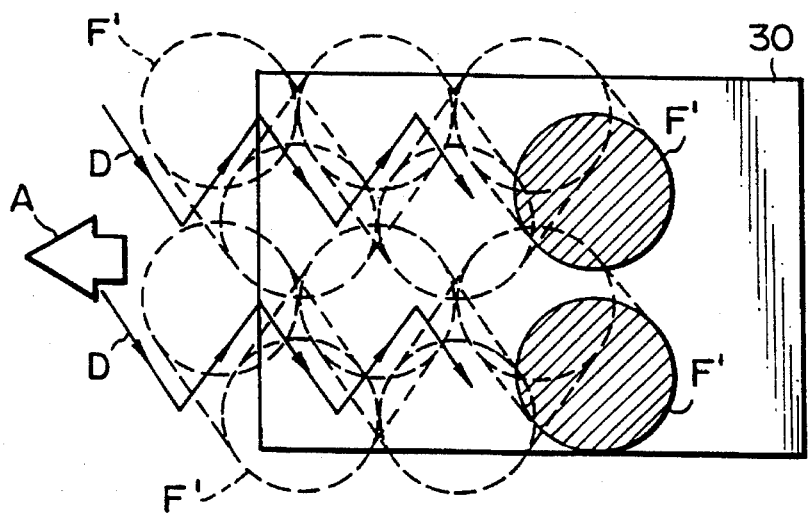

FIG. 8
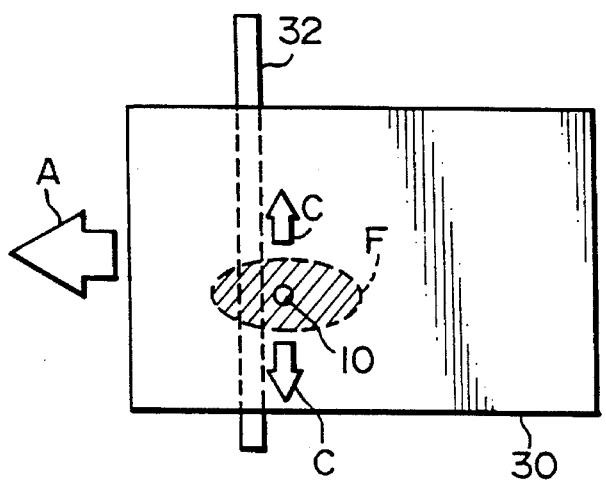
FIG. 8A
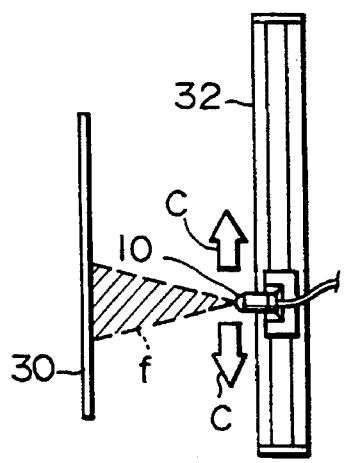
FIG. 8B
FIG. 9
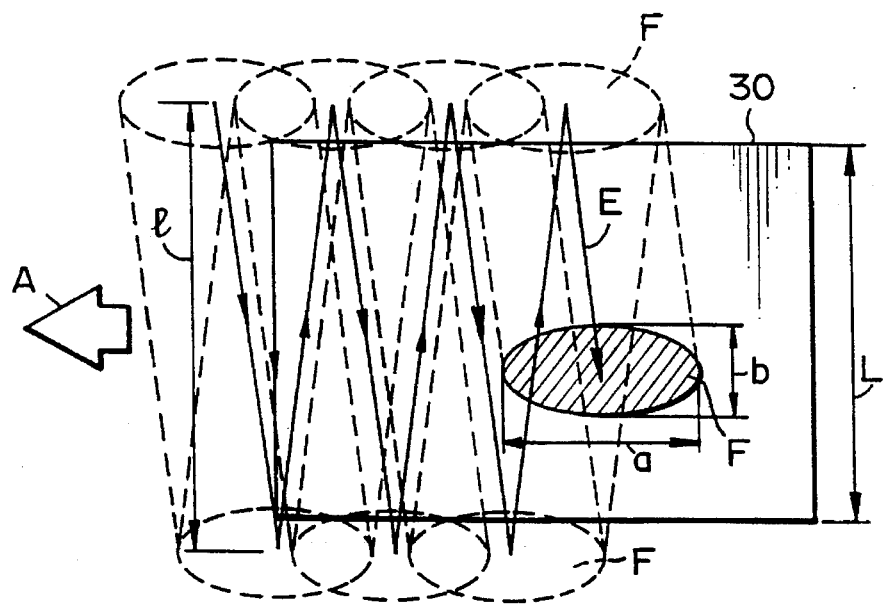

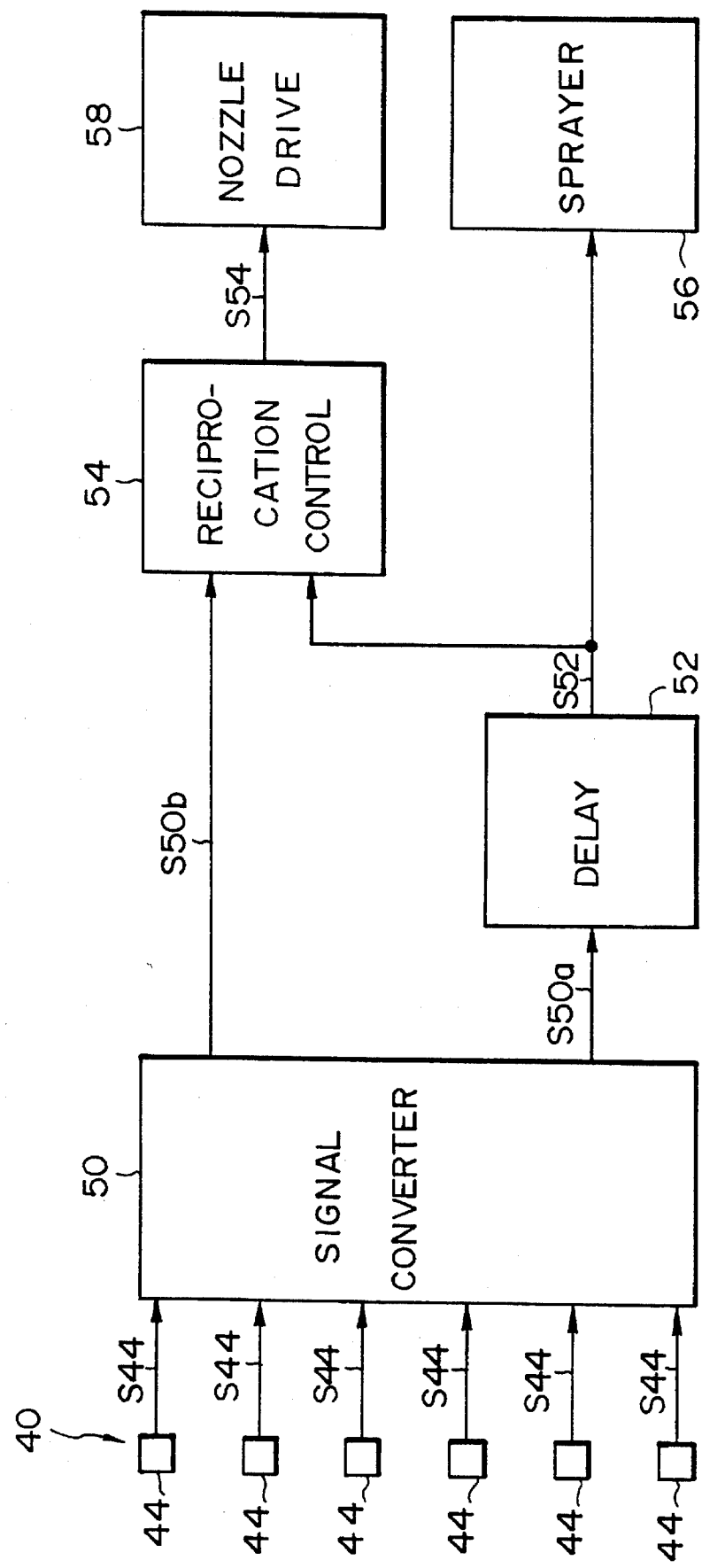

SPRAY TYPE FLUX APPLYING DEVICE

This is a continuation of application Ser. No. 07/722,016 filed on Jun. 27, 1991, now abandoned.

BACKGROUND OF THE INVENTION

The present invention relates to a device for spraying flux to apply it to the rear of a printed circuit board which is loaded with electronic parts on the front thereof.

Many of modern electronic equipment accommodate therein one or more printed circuit boards each being loaded with necessary electronic parts on the front thereof. After electronic parts have been mounted on the front of such a circuit board, flux is applied to the rear of the circuit board while the circuit board is transported by a conveyor or similar transport mechanism. For the application of flux, various types of applying devices are extensively used such as a foam type applying device and a spray type applying device. A spray type flux applying device, for example, has at least one nozzle to which flux and air are fed at the same time. Having a nozzle hole at the tip thereof, the nozzle atomizes the flux and sprays it onto a printed circuit board though the nozzle hole.

It is a common practice with the conventional spray type flux applying device to affix one or more nozzles to the casing of the device. Usually, the flux is deposited in an oval configuration when sprayed onto an object. Assume that a single nozzle is affixed to the casing of the device to spray flux onto the rear of a printed circuit board which is transported by, for example, a conveyor. Then, the effective application area as measured on the rear of the circuit board is about 150 millimeters at most in terms of the longer diameter of the oval and is generally smaller than the size of an ordinary printed circuit board. Hence, it has been customary to mount a plurality of nozzles rigidly on the casing of the applying device. However, it is extremely difficult to apply flux uniformly over the predetermined application area of a printed circuit board by use of such a spray type applying device due to three major problems as follows. A first problem is that each nozzle cannot uniformly apply flux to the entire effective application area thereof. A second problem is that the sprays from nearby nozzles interfere with each other in a portion where the effective application areas of the nozzles overlap. This is partly because the amount of flux to be sprayed, drop size and effective application area slightly differ from one nozzle to another due to the limited machining accuracy and partly because a plurality of such nozzles are used. A third problem is that not all of the printed circuit boards have identical dimensions.

Under the above circumstances, it is necessary to adjust, mainly by hand, the position and angle of each nozzle, the positional relation of the nozzles to one another, and the number of nozzles so as to adjust the application area, nozzle by nozzle. This is extremely time- and labor-consuming and requires an expert. In practice, therefore, the adjustment of the application area is rarely performed. Usually, an application area matching a printed circuit board having the maximum size is fixedly set and applied even to printed circuit boards of smaller sizes. As a result, sprayed flux deposits not only on the circuit boards but also on the structural members of the applying device and the conveyor, resulting in the waste of flux. Especially, a collecting device for collecting the drops of flux not deposited on the circuit boards and conveyor is heavily smeared and has to be cleaned or replaced by troublesome operations.

The above-described type of flux applying device has a non-hermetic reservoir storing flux therein, and a conduit communicating the reservoir to the nozzle. The feed of the flux from the reservoir to the nozzle is implemented by the difference in level between the nozzle and the liquid level in the reservoir, i.e., the weight of the flux. This brings about a problem that as the liquid level in the reservoir changes due to the consumption of the flux or the supply of fresh flux to the reservoir, the pressure acting on the flux inside the reservoir and, therefore, the amount of flux to be sprayed from the nozzle changes. In addition, since the reservoir is not hermetically closed, the solvent contained in the flux is apt to evaporate with the result that the concentration of the flux changes over time.

While the conventional device feeds flux and air to the nozzle, it cannot control the feed of flux and that of air independently of each other, i.e., it simply starts and stops feeding flux and air at the same time. It follows that when the spray of flux from the nozzle is stopped, the flux is left at the tip of the nozzle and then dried to clog the nozzle hole, obstructing stable spraying. More specifically, comparatively large drops of flux are ejected from the nozzle at the beginning of spraying, preventing the flux from being applied in a uniform distribution to an object.

SUMMARY OF THE INVENTION

It is therefore an object of the present invention to provide a spray type flux applying device capable of applying flux uniformly over the entire application area of a printed circuit board.

It is another object of the present invention to provide a spray type flux applying device capable of automatically changing the application area of a printed circuit board in matching relation to the size of the circuit board.

It is another object of the present invention to provide a spray type flux applying device which eliminates the need for the adjustment of a nozzle with no regard to the size of a printed circuit board to be treated.

It is another object of the present invention to provide a spray type flux applying device capable of adjusting the amount of flux to be sprayed from a nozzle.

It is another object of the present invention to provide a spray type flux applying device which prevents a nozzle thereof from being stopped up.

It is another object of the present invention to provide a spray type flux applying device.

In accordance with the present invention, a device for spraying flux to apply it to an object being transported by a transport mechanism comprises a single nozzle located in a spraying position for spraying the flux, and a nozzle drive for moving the nozzle in a reciprocating motion in a direction perpendicular to an intended direction of transport of the object.

Also, in accordance with the present invention, a device for feeding flux to at least one nozzle of a device which sprays the flux to apply it to an object being transported by a transport mechanism comprises a non-hermetic reservoir storing the flux therein, a conduit for feeding the flux from the reservoir to the nozzle, and a measuring unit disposed in the conduit for measuring the flow rate or the flux.

Further, in accordance with the present invention, a device for feeding flux to at least one nozzle of a device which sprays the flux to apply it to an object being transported by a transport mechanism comprises a hermetically closed pressurized reservoir storing the flux therein, a conduit for feeding the flux from the reservoir to the nozzle, and a pressure governing unit for maintaining the pressure in the reservoir at a predetermined pressure.

Moreover, in accordance with the present invention, a device for spraying flux by at least one nozzle located at a spraying position to apply the flux to an object being transported by a transporting mechanism comprises an object sensing unit for sensing a lenght of the object in transport with respect to a direction perpendicular to an intended direction of transport of the object and determining whether or not the object is present in the spraying position, and air feeding device for feeding air to the nozzle, a flux feeding device for feeding the flux to the nozzle, and a controller for controlling, in response to a detection out of the object sensing unit, the air feeding device and flux feeding device such that the feed of air and the feed of flux to the nozzle each occurs at a particular timing.

BRIEF DESCRIPTION OF THE DRAWINGS

The above and other objects, features and advantages of the present invention will become more apparent from the following detailed description taken with the accompanying drawings in which;

FIGS. 4, 4A and 4B is a view similar to FIG. 2, showing another conventional flux applying device of the type described;

FIG. 5 is a view similar to FIG. 3, showing the relative movement of a printed circuit board to be treated by the device of FIG. 4 and application areas thereof;

FIGS. 6, 6A and 6B is a view similar to FIG. 2, showing another conventional flux applying device of the type described;

FIG. 7 is a view similar to FIG. 3 and pertaining to the device of FIG. 6;

FIGS. 8, 8A and 8B shows a spray type flux applying device embodying the present invention in a top plan view, a front view, and a side elevation;

FIG. 9 shows the relative movement of a printed circuit board to be treated by the embodiment and an application area thereof;

FIG. 11 is a block diagram schematically showing a specific construction of control circuitry for controlling the device of FIG. 10;

DESCRIPTION OF THE PREFERRED EMBODIMENTS

To better understand the present invention, a reference will be made to conventional spray type devices for applying flux to an object in the form of a printed circuit board.

Figure 1:
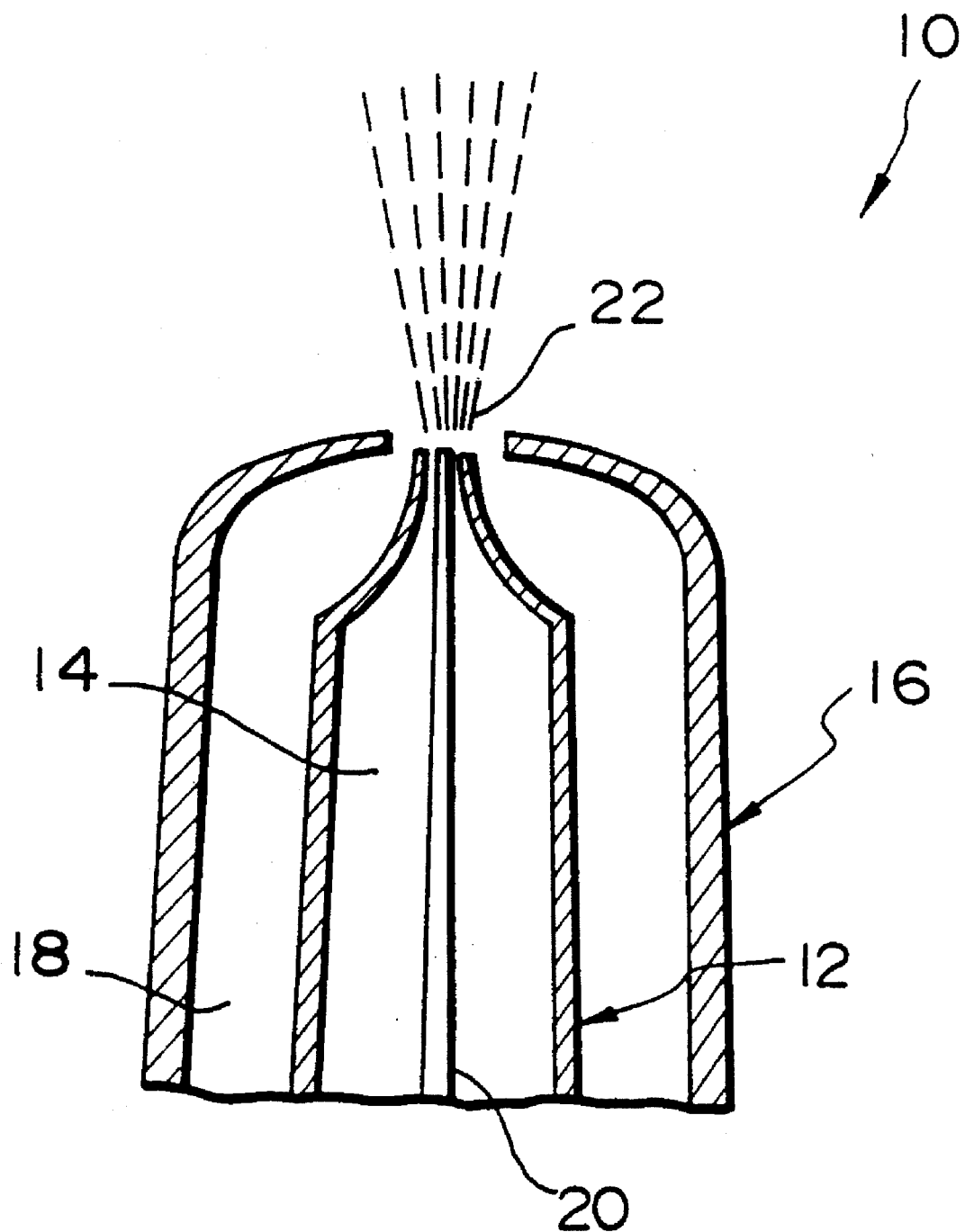
FIG. 1 is a section showing the construction of a nozzle included in a conventional spray type flux applying device and applicable to preferred embodiments of the present invention.

Referring to FIG. 1, a nozzle included in conventional devices and applicable to various embodiments of the present invention which will be described is shown. As shown, the nozzle, generally 10, is made up of an inner tube or flux nozzle 12, an outer tube or air nozzle 16, and a needle 20. The flux nozzle 12 forms a flux passage 14 thereinside to which flux is fed, while the air nozzle 16 forms an air passage 18 which surrounds the flux nozzle 12. The needle 20 is disposed in the flux passage 14. The flux nozzle 12 has a hole 22 at the tip thereof for ejecting flux therethrough. The needle 20 is movable up and down a direction perpendicular to the center of the nozzle hole 22. An air compressor, not shown, delivers air under pressure to the air passage 18 defined between the flux nozzle 12 and the air nozzle 16. Part of the compressed air from the air compressor is used to control the position of the needle 20. Specifically, when flux is not sprayed, the compressed air is not communicated to the air path 18 and, therefore, the needle 20 is held in a position where it blocks the nozzle hole 22. When the compressed air is fed to the air passage 18 for spraying flux, the needle 20 is move downward as viewed in the figure, unblocking the nozzle hole 22.

Figure 2:
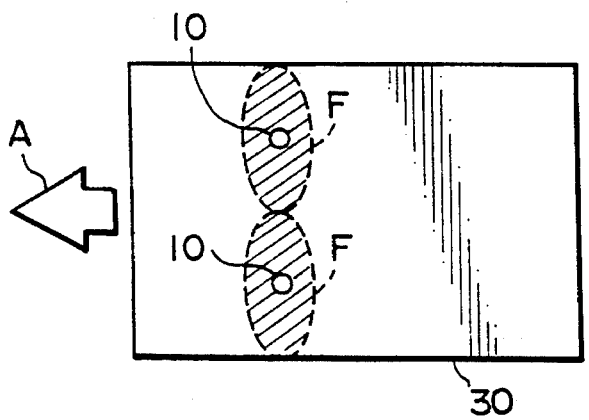
FIGS. 2, 2A and 2B shows a conventional spray type flux applying device, particularly the positional relation between nozzles thereof, in a top plan view, a front view, and a side elevation.
Figure 2A:
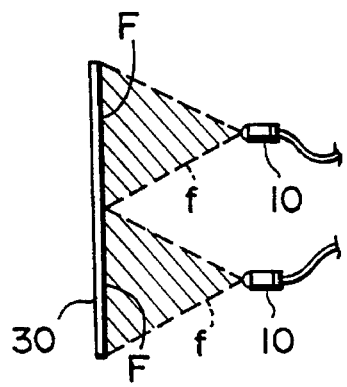
Figure 2B:
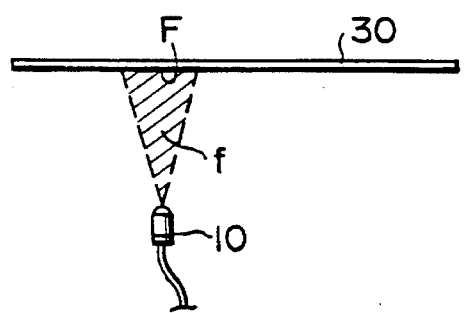
Figure 3:
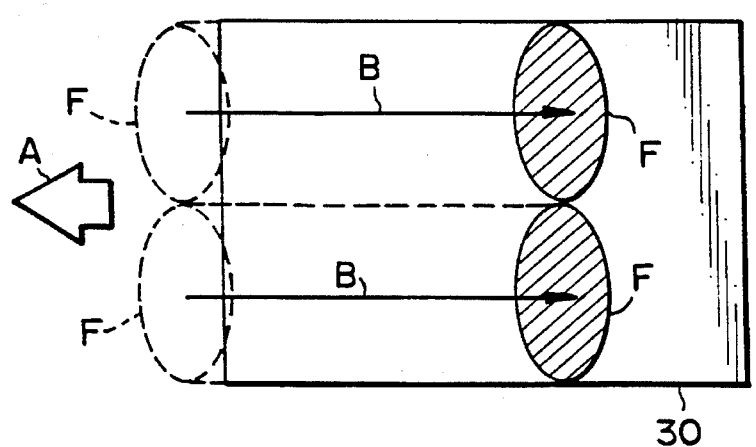
FIG. 3 shows the relative movement of a printed circuit board to be treated by the device of FIG. 2 and application areas thereof.

A conventional spray type flux applying device has a casing on which a plurality of nozzles 10 are mounted. The device sprays flux onto the rear surfaces of printed circuit boards which are loaded with electronic parts and transported by a conveyor or similar transport arrangement. For example, as shown in FIGS. 2, 2A and 2B two nozzles 10 are mounted on the casing and spaced apart by a predetermined distance in a direction perpendicular to a direction A in which a printed circuit board 30 moves. As FIGS. 2, 2A and 2B indicates, each nozzle 10 sprays flux f over a generally oval area F of the printed circuit board 30. Let this area F be referred to as an effective application area. The nozzles 10 each is positioned such that the longer diameter of the oval effective application area F is perpendicular to the direction A. As shown in FIG. 3, when the two nozzles 10 spray the flux f onto the rear surface of the printed circuit board 30 being transported in the direction A, the effective application areas F of the nozzles 10 cover the entire area of the circuit board 30. In FIG. 3, the movement of the nozzles 10 and their effective application areas F relative to the circuit board 30 is indicated by arrows B. Such a conventional device has three major problems left unsolved; as mentioned earlier and as will be discussed hereinafter more specifically.

The first problem is that each nozzle 10 cannot apply flux uniformly to the entire effective application area F, i.e., the amount of flux is greatest at the position of the circuit board 30 which is aligned with the axis of the nozzle 10 and sequentially decreases toward the periphery of the area F. Therefore the device shown in FIGS. 2 and 3 cannot apply flux in a uniform distribution to the entire surface of the circuit board 30.

The second problem stems from the fact that balancing the plurality of nozzles 10 is difficult. Generally, the nozzles 10 have some irregularities in, for example, the amount of spray, drop size and effective application area due to limited machining accuracy. Further, the sprays of flux from the nozzles 10 interfere with each other in a portion where the nearby effective application areas F overlap. This interference problem is related to the position of each nozzle 10 relative to the casing and the angle thereof to the printed circuit board 30. Specifically, the amount of application is greater in the interfering portion than in the other positions due to double application or, rather, smaller in the former than in the latter even when the nozzles 10 are brought closer to each other. Adjusting the positions and angles of each nozzle 10 to eliminate the above problems is time- and labor-consuming and, moreover, requires an expert.

The third problem is that the size and other conditions of the printed circuit boards 30 to be dealt with are not constant. It is likely, therefore, that flux is directly applied to various structural members of the device as well as the conveyor or similar transport mechanism. Hence, the application area of each nozzle 10 has to be adjusted. However, when the nozzles 10 are arranged as shown in FIGS. 2, 2A and 2B, adjusting the individual application areas is extremely difficult. Specifically, should the relative position of the nozzles 10 be changed, the previously stated second or interference problem would arise to obstruct the uniform application of flux. Furthermore, since the sprays of flux of nearby nozzles effect each other, a change in the number of nozzles 10 to join in the application disturbs the relation of the sprays to one another, again resulting in the non-uniform application of flux. While the amount of application and the size of drops of flux may be adjusted in matching relation to the size and other conditions of the printed circuit boards 30, such adjustment changes the flow rate of sprays and the effective application area, aggravating the non-uniform application of flux.

Some efforts have heretofore been made to eliminate the three problems discussed above. For example, as shown in FIG. 5, the longer diameter of each oval effective application area F may be rotated by about 30 degrees such that it extends obliquely relative to the direction A in which the printed circuit board 80 moves, thereby reducing the interference between nearby sprays. At the same time, as shown in FIG. 5, the distance between nearby nozzles 10 may be reduced to cause the sprays of flux to overlap around the boundary between the effective application areas F. This compensates for the decrease in the amount of application at the portions remote from the axis of the nozzle 10. However, although reducing the distance between the nozzles 10 may suppress the non-uniform distribution of flux within each effective application area F, it makes the balance between the nozzles 10 more difficult to achieve. This relation will be inverse when the distance between the nozzles 10 is increased. Moreover, the number of nozzles 10 has to be increased to make up for the decrease in the effective application area F per nozzle 10, as measured in the widthwise direction of the circuit board 30, which is ascribable to the rotation of the application area F. Specifically, in FIGS. 4, 4A, 4B and 5, there are shown three nozzles 10 in place of two nozzles 10. As a result, the difficulty in balancing the nozzles 10 is aggravated. In addition, such an implementation leaves the third problem still left unsolved.

In light of the above, use may be made of ultrasonic spray nozzles 10A, as shown in FIGS. 6, 6A and 6B. The ultrasonic spray nozzles 10A each sprays flux at a low rate and with weak directivity and, therefore, reduce the effects of the first problem. Such nozzles 10A, however, cannot deposit flux fast on the rear of the printed circuit board 30 and fail to accurately define the application areas. It is necessary, therefore, to reduce the distance between the nozzles 10A and the circuit board 30 to one-half to one-fourth of the distance available with the air spray type nozzles 10. As a result, the effective application area $F^2$ per nozzle is extremely reduced and has a substantially circular configuration as illustrated. To eliminate this drawback, the nozzles 10A are mounted on a guide 32 and moved along the guide 32 in a reciprocating motion in a direction perpenticular to the direction A, i.e., in a widthwise direction C. As a result, the nozzles 10A spray flux in the manner shown in FIG. 7. In FIG. 7, arrows D indicate the movement of the nozzles 10A and effective application areas $F^1$ relative to the circuit board 30. Further, as shown in FIGS. 6, 6A and 6B, the axis of each nozzle 10A is inclined relative to the vertical to increase the effective application area $F^1$. Such implementations are successful in substantially overcoming the first problem. Regarding the second problem, the mutual interference of sprays is not noticeable since the nozzles 10A are spaced apart by a substantial distance. Nevertheless, the non-uniform application ascribable to the scattering in accuracy among the nozzles 10A and the overlap of nearby nozzles 10A with respect to the sprays is not eliminated. Regarding the third problem, the adaptability to the dimensions of the circuit board 30 is not improved since the distance between the nozzles 10A and the distance of reciprocating movement of the nozzles 10A are closely related and since the distance between the nozzles 10A cannot be reduced beyond a certain limit. Moreover, the nozzles 10A used to eliminate the first problem make it difficult to adjust the drop size of sprays and the amount of application and thereby further limits the adaptability to the configuration of the circuit board 30. In addition, the application efficiency, i.e., the amount of application divided by the amount of spray available with the nozzles 10A is inherently low, so that the application condition is susceptible to the streams of air around the device.

Preferred embodiments of the present invention which are free from the problems discussed above will be described hereinafter. In the embodiments, the components functionally equivalent to the components of the conventional device shown in FIGS. 1 through 7 will be designated by the same reference numerals, and redundant description will be avoided for simplicity.

Referring to FIGS. 8, 8A, 8B and 9, a spray type flux applying device embodying the present invention is shown and has a guide 32 for moving a nozzle 10 therealong. As shown in FIGS. 8, 8A and 8B, the guide 32 is positioned in a horizontal plane and extends in a direction C perpendicular to a direction A in which a printed circuit board 30 moves. The single nozzle 10, therefore, sprays flux while moving in the direction C in a reciprocating motion. The air spray type nozzle 10 has an oval effective application area F whose longer diameter is perpendicular to the direction C. Such a position of the application area F eliminates the previously stated first problem, as follows. FIG. 9 depicts a relation between the circuit board 30 and the effective application area F particular to the embodiment. Assuming that the nozzle 10 moves at an eight times higher speed than the circuit board 30, then the nozzle 10 applies flux to a given portion of the circuit board 30 two to four consecutive times little by little. The nozzle 10, therefore, applies flux uniformly to the circuit board 30 in both the portion aligned with the axis of the nozzle 10 and the other portion, thereby eliminating the non-uniform distribution of flux within the effective application area F. This effect is more enhanced as the number of times that the the nozzle 10 applies flux to the same portion of the circuit board 30 increases i.e., as the moving speed Vn of the nozzle 10 increases relative to the moving speed Vp of the circuit board 30. The ratio Vn/Vp should only be determined in consideration of the longer diameter α of the effective application area F and the distance l which the nozzle 10 moves each way.

In the illustrative embodiment, the above-mentioned distance l is selected to be greater than the width L of the printed circuit board 30 in order to allow the circuit board 30 to be coated all over. Theoretically, the single nozzle 10 can apply flux to the entre surface of the circuit board 30 if it is moved in a reciprocating motion over a distance produced by substracting the shorter diameter δ of the effective application area F from the width L, i.e., (L-b) the center of which is the intermediate point of the circuit board 30 in the widthwise direction. The embodiment using the single nozzle 10 does not have the problem particular to a plurality of nozzles and fully eliminates the second problem.

In the illustrative embodiment, the application area on the circuit board 30 can be readily changed in matching relation to the dimensions and other conditions of the circuit board 30 only if the distance l of movement of the nozzle 10 is changed. Such a change in the distance l does not disturb the uniform application of flux to the circuit board 30 at all. Even when the drop size of the spray or the amount of application is changed, the uniform application of flux to the circuit board 30 is insured despite the resultant change in the flow rate of the spray or the effective application area. This is because the embodiment causes a single nozzle to coat each portion of the circuit board 20A more than once.

As stated above, this embodiment eliminates the need for the adjustment particular to the multiple nozzle scheme since it moves the single nozzle 10 in a reciprocating motion in the direction C perpendicular to the moving direction A of the printed circuit board 30. The nozzle 10 effects repetitive application of flux over the entire surface of the circuit board 30, thereby realizing extremely uniform application. The embodiment readily copes with a change in the size of the circuit board 30. Even when the application area, the amount of application and/or the drop size is changed, the even application is insured. Of course, the nozzle 10 may be moved in a direction other than the direction C perpendicular to the moving direction A of the circuit board so long as the above advantages are achievable.

Figure 10:
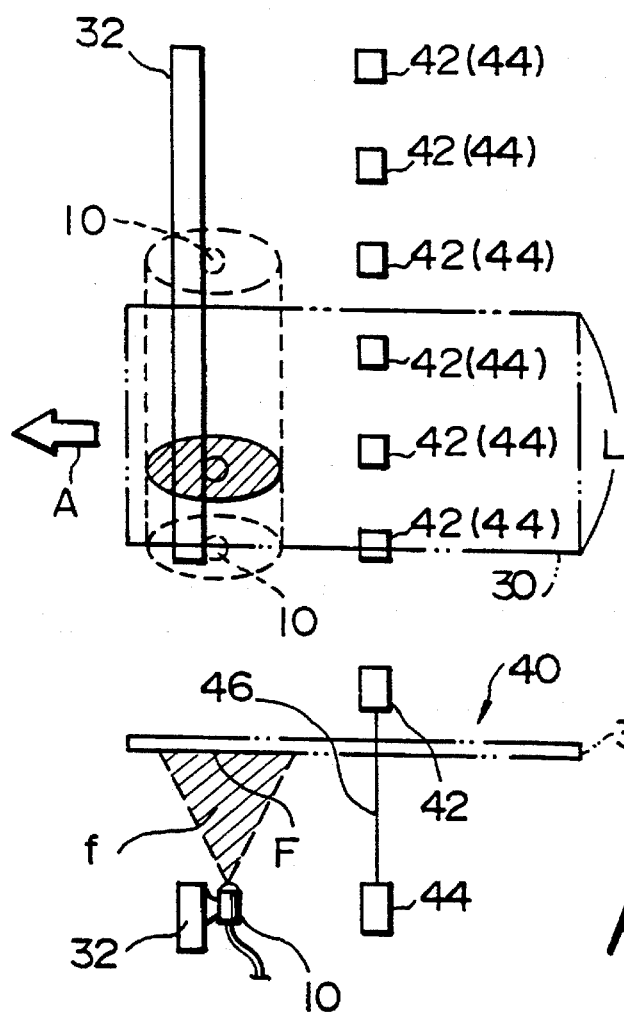
FIGS. 10, 10A and 10B is a view similar to FIG. 8, showing an alternative embodiment of the present invention.
Figure 10A:
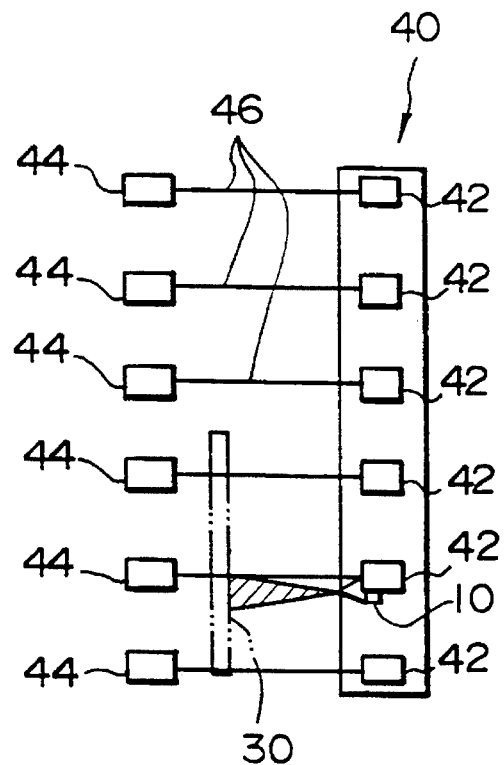
Figure 10B:
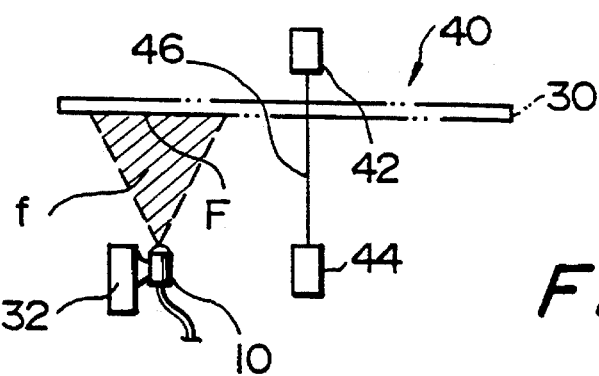

FIGS. 10, 10A and 10B shows an alternative embodiment of the present invention which automatically changes the distance l which the nozzle 10 moves in matching relation to the width L of the printed circuit board 30. As shown, this embodiment has, in addition to the components of the previous embodiment, a sensing device 40 for determining that the circuit board 30 has approached or entered the device and the width L of the circuit board 30. The sensing device 40 may be implemented as six sensors each comprising a light emitting element 42 and a light-sensitive element 44 which face each other on opposite sides of the path along which the circuit board 30 moves, as illustrated. Such six sensors 42 and 44 are arranged at spaced locations in the direction C perpendicular to the direction A at predetermined intervals. While the circuit board 30 moves the path between the light emitting elements 42 and their associated light-sensitive elements 44, it intercepts part of the light issuing from the light emitting elements 42 over the width L with the result that the associated light-sensitive elements 44 do not sense light at all. It is, therefore, possible to determine the width L of the circuit board 30 and that the circuit board 30 has approached or entered the application position, on the basis of the relation among the light-sensitive elements 44 which do not sense light.

FIG. 11 shows circuitry for controlling the device shown in FIGS. 10, 10A and 10B. As shown, the six sensors constituting the sensing device 40 are connected to a signal converter 50. When light issuing from any of the light emitting elements 42 is intercepted by the circuit board 30, the associated light-sensitive element sends a signal S44 to the signal converter 50. In response to such signals S44, the signal converter 50 determines whether or not the circuit board 30 exists in a plane perpendicular to the direction C and where the sensors are positioned, and the length over which the light is intercepted, i.e., the width L of the circuit board 30. Specifically, when two or more of the light beams 46 are intercepted, the signal converter 50 determines that the circuit board 30 has reached the above-mentioned plane, i.e., sensing plane. As the number of light beams 46 which are intercepted increases, the signal converter 50 determines that the circuit board 30 has a greater width L. The signal converter 50 delivers a signal S50a indicative of the presence/absence of the circuit board 30 to a delay 52. The delay 52 delays the input signal S50a by a period of time necessary for the circuit board 30 to move from the sensing plane to a plane where the nozzle 10 is movable along the guide 32 in a reciprocating motion while spraying flux, i.e., spraying plane. The output S52 of the delay 52, therefore, shows whether or not the circuit board 30 exists in the spraying plane. The signal S52 is applied to a reciprocation control unit 54 and a sprayer 56. In response, the sprayer 56 sprays flux while the circuit board 30 moves through the spraying plane. The signal converter 50 delivers a signal S50b representative of the width L of the circuit board 30 to the reciprocation control unit 54. In response to the signals S50b and S52, the reciprocation control unit 54 sets up a range for causing the nozzle 10 to move back and forth. At the same time, the reciprocation control unit 54 feeds an output S54 thereof to a nozzle drive 58, so that the nozzle 10 may move in a reciprocating motion over the set range until the circuit board 30 moves away from the spraying plane.

Figure 12:
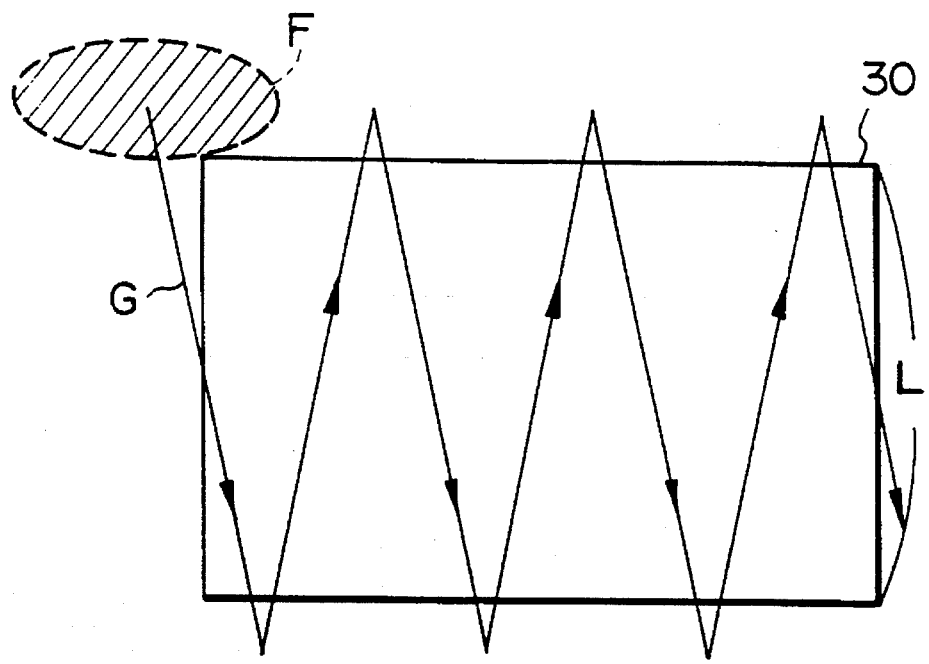
FIGS. 12 and 13 each shows a particular movement of a nozzle included in the device of FIG. 10 relative to a printed circuit board having a relatively large size or a small size.
Figure 13:
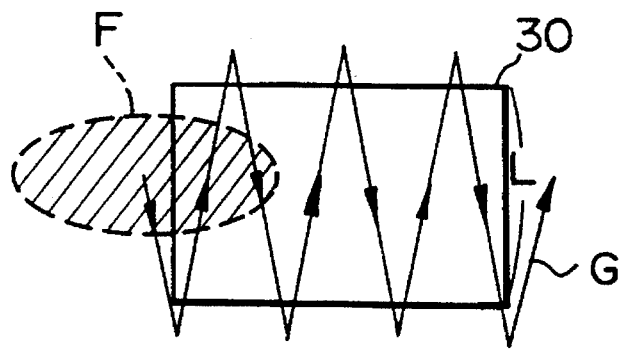

Consequently, the nozzle 10 sprays flux while moving back and forth over the range substantially equal to the width L of the circuit board 30, until the circuit board 30 leaves the spraying plane. FIGS. 12 and 13 each shows a particular movement of the nozzle 10 relative to the circuit board 30. Specifically, the nozzle 10 moves as shown in FIG. 12 when the width L of the circuit board 30 is relatively great or as shown in FIG. 13 when it is relatively small. As shown, the locus G of the nozzle 10 does not noticeably protrude from the surface of the circuit board 30 with no regard to the size of the circuit board 30. Hence, flux is sprayed only onto the circuit board 30 and in a uniform distribution.

Figure 14:
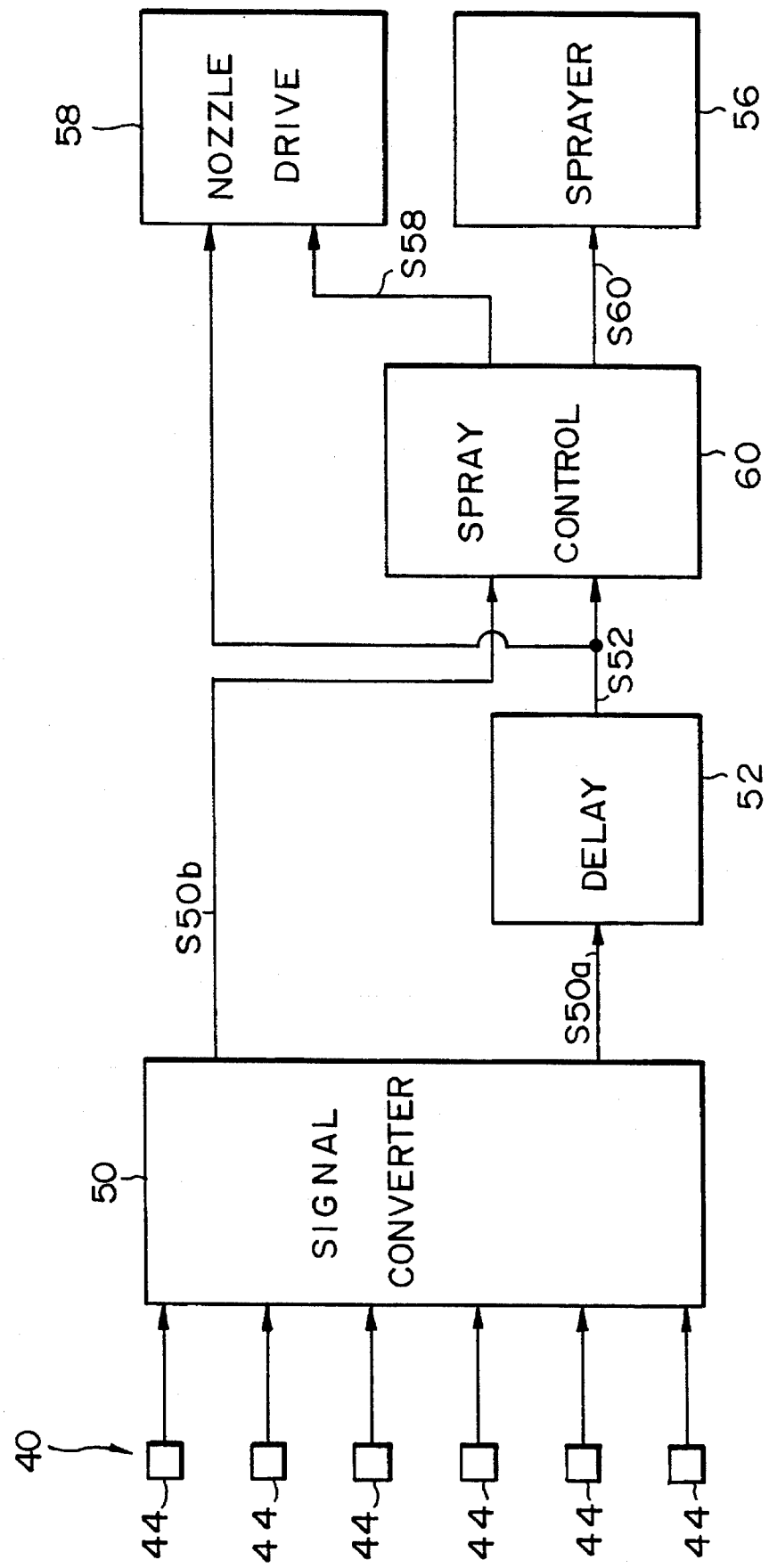
FIG. 14 is a block diagram showing another specific construction of the control circuitry.
Figure 15:
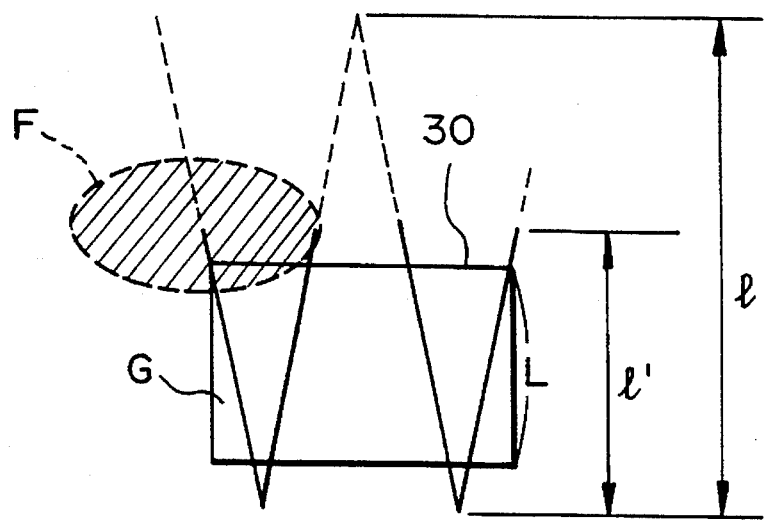
FIG. 15 shows the movement of a nozzle which sprays flux onto a printed circuit board under the control of the circuitry of FIG. 14 relative to the circuit board.

FIG. 14 shows another specific construction of the control circuitry of the embodiment. In FIG. 14, the same blocks as those shown in FIG. 11 are designated by the same reference numerals. As shown, the presence/absence signal S50a from the signal converter 50 is applied to a spray control unit 60 and the nozzle drive 58 via the delay 52. In response, the nozzle drive 58 continuously operates until the circuit board 30 moves away from the spraying surface. In this case, the nozzle 10 is moved over the maximum movable range at all times. The nozzle drive 58 continuously senses the the position of the nozzle 10 on the locus of reciprocation while sending the resultant signal S58 to the spray control unit 60. Also applied to the spray control unit 60 is the width signal S50b from the signal converter 50. In response to the three inputs, i.e. based on the presence/absence of the circuit board 30 in the spraying plane, the width L of the circuit board 30, and the instantaneous position of the nozzle 10, the spray control unit 14 feeds a control signal S60 to the sprayer 56 such that the nozzle 10 sprays only when it moves beneath the circuit board 30. FIG. 15 shows the movement of the nozzle 10 relative to the circuit board 30 and specific ON/OFF control over the spray associated therewith, on the assumption that the width L of the circuit board 30 is relatively small. As shown, the reciprocation of the nozzle 10 occurs over a range, i.e., distance l which is far greater than the width L of the circuit board 30. Nevertheless, the nozzle 10 sprays only when it moves beneath the circuit board 30 with the result that flux is applied substantially only to the circuit board 30 and in a uniform distribution.

As stated above, this embodiment moves the single nozzle 10 in the direction C perpendicular to the moving direction A of the printed circuit board and has a device for sensing the width L of the circuit board 30. The spray is ON/OFF controlled or the movable range of the nozzle 10 is controlled on the basis of the sensed width L, enhancing the adaptability to the size of the circuit boards 30.

Hereinafter will be described a device for feeding flux to the nozzles 10 included in any of the embodiments shown and described.

Figure 16:
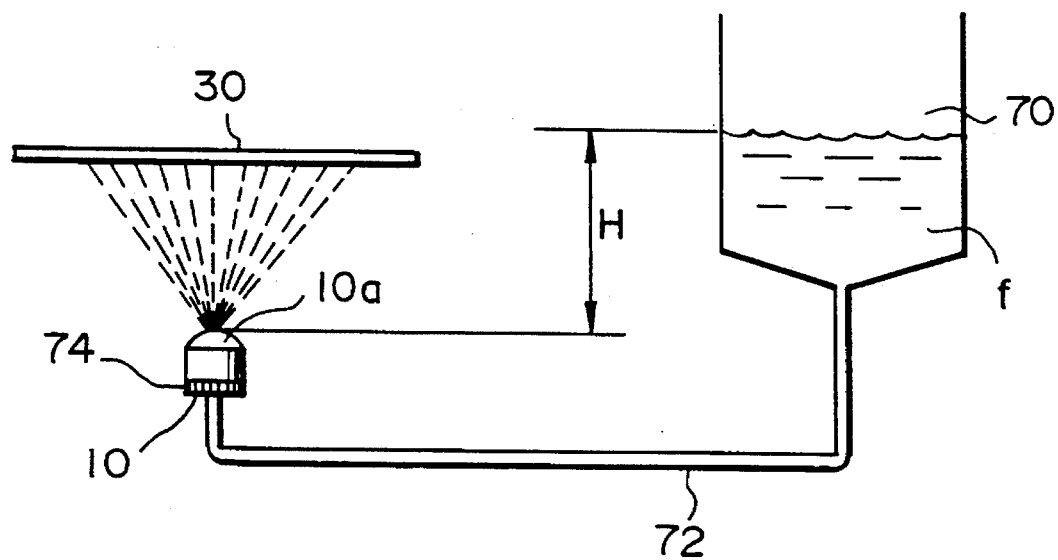
FIG. 16 shows a conventional flux feeding device.

As shown in FIG. 16, it has been customary to supply flux f from a non-hermetic reservoir 70 to a flux applying device via a conduit 72 interconnecting the reservoir 70 and the nozzle 10. The reservoir 70 is positioned at such a level that the liquid level in the reservoir 70 is higher than the tip 10a of the nozzle 10 by H, so that the flux f may be fed to the nozzle 10 by gravity. A dial 74 is associated with the nozzle 10 for adjusting the opening degree of the nozzle 10. Specifically, the position of the needle 20, FIG. 1, is variable in the up-and-down direction by the dial 74. Since the needle 20 changes the cross-sectional area of the nozzle hole 22, FIG. 1, the amount of flux f to be sprayed can be controlled by the dial 74. Usually, use is made of clicks which control the rotation angle of the dial 74. For example, assuming that twelve clicks are arranged at equally spaced locations in the circumferential direction of the dial 74, one click corresponds to a rotation angle of 30 degrees. Then, when the dial 74 is rotated twenty clicks from the position where the needle 20 fully closes the nozzle hole 22 in a direction for opening the nozzle hole 22 (or lowering the needle 20), the dial 74 rotates one full rotation plus 240 degrees. As a result, the needle 20 is lowered via a screw mechanism, not shown, to open the nozzle hole 22 by an amount corresponding to the rotation of the dial 74. More specifically, the number of clicks as counted from the full-close position of the dial 74 is associated with the opening degree of the nozzle hole 22, so that the amount of spray can be supervised on the basis of the number of clicks.

The problem with such a conventional flux feed arrangement is that as the liquid level in the tank 70 changes due to the consumption of the flux f or the supply of fresh flux f, the pressure under which the flux f is fed to the nozzle 10 and, therefore, the amount of spray changes. Another problem is that the flux concentration sequentially changes since the solvent contained in flux f is apt to evaporate due to the non-hermetic reservoir 70. Regarding the dial 74, the accuracy is too low to insure reproducibility in the relation between the number of clicks and the opening degree of the nozzle hole 22. More specifically, for a given number of clicks, the opening degree of the nozzle hole 22 is not always constant to make it difficult to adjust the amount of spray accurately. Since the effective value of the amount of spray is not supervised at all, the actual amount of spray is apt to differ from the desired value or, when the amount of spray is unexpectedly changed due to ambient conditions, the difference or the change cannot be detected. This eventually aggravates the rate at which the soldering of circuit boards 30 fails. The relation between the number of clicks and the opening degree of the nozzle hole 22 differs from one nozzle to another due to the scattering in machining accuracy among the tips of the nozzles and those of the needles 20, so that the number of clicks is not common. Moreover, to confirm or reproduce the number of clicks, the operator has to return the dial 74 to the full-close position and then count the clicks again, resulting in low operability.

Figure 17:
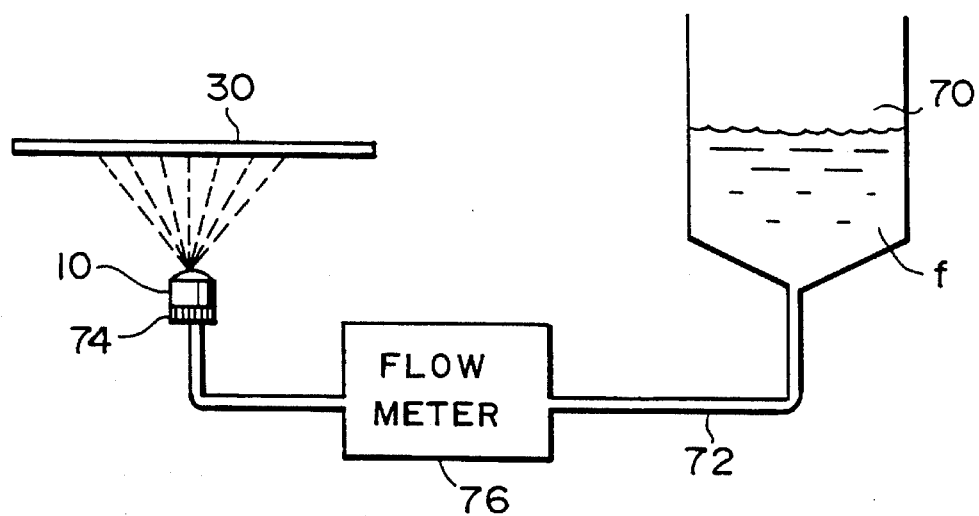
FIGS. 17 through 20 each shows a preferred embodiment of a flux feeding device in accordance with the present invention.

Referring to FIG. 17, a flux feeding device embodying the present invention is shown which is free from the above-discussed drawbacks. As shown, the flux f is communicated from the reservoir 70 to the nozzle 10 by a conduit 72. The amount of flux being sprayed from the nozzle 10 is equal to the flow rate of the flux in the conduit 72. A flow meter 76 is disposed in the conduit 72 to measure the flow rate of the flux, i.e., the amount of spray from the nozzle 10. While the amount of spray is adjusted by the dial 74 as in the conventional device, this embodiment supervises the degree of adjustment in response to the output of the flow meter 76. Specifically, the operator adjusts the opening degree of the needle 20 by the dial 74 while monitoring the effective value on the flow meter 76. This allows the amount of spray to be adjusted with accuracy. Even when the amount of spray is unexpectedly changed due to ambient conditions, such a change can be immediately detected on the basis of the output of the flow meter 76 and corrected.

Figure 18:
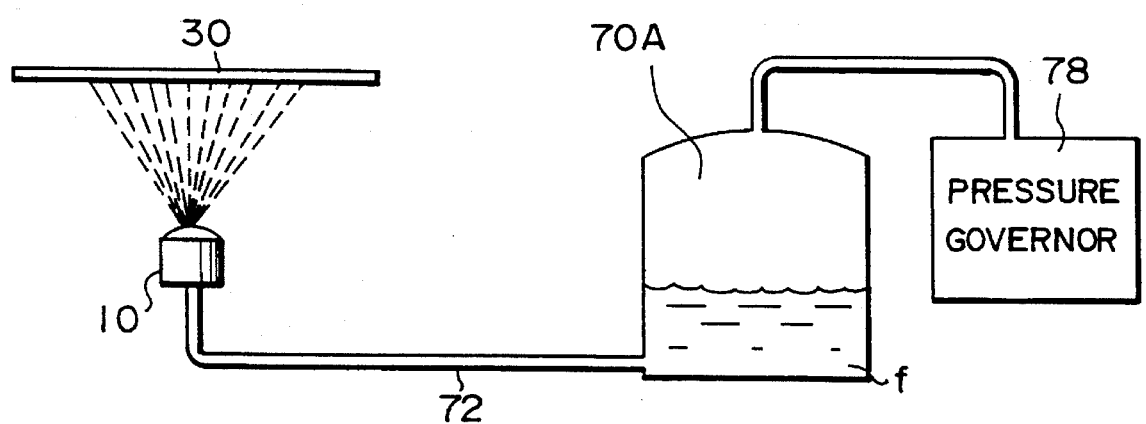

FIG. 18 shows an alternative embodiment of the flux feeding device in accordance with the present invention. As shown, the flux f is fed under pressure from a hermetically closed pressurized reservoir 70A to the nozzle 10. A pressure governor 78 maintains the pressure inside the reservoir 70A constant. Although the pressure inside the reservoir 70A may change due to the consumption of the flux f or the change in the air temperature inside the reservoir 70A, the pressure governor 78 automatically restores the pressure to original. As a result, the flux f is communicated to the nozzle 10 under constant pressure. When the amount of flux f remaining in the reservoir 70A and, therefore, the liquid level therein is changed, the pressure under which the flux f is fed changes in proportion to the liquid pressure ascribable to the weight of the flux f. Nevertheless, such a change in pressure is negligibly small, compared to the pressure inside the reservoir 70A. In this embodiment the nozzle 10 is not provided with the dial 74 and the pressure inside the reservoir 70A is variable to adjust the amount of spray of the flux f; increasing the pressure inside the reservoir causes the pressure acting on the flux f and, therefore, the amount of spray to increase.

When the spray is interrupted, the needle 20 protrudes to fully block the nozzle opening 22, as in FIG. 1. Hence, the flux f is prevented from leaking despite the pressure acting thereon. To spray the flux f, the needle 20 is automatically lowered to fully unblock the nozzle hole 22 by air under pressure. Therefore, the nozzle hole 22 is continuously open as long as the spraying operation is under way, so that the amount of spray is adjusted only by the pressure acting on the flux f. This allows the amount of spray to be finely and accurately adjusted and enhances the reproducibility. In this embodiment, the nozzle hole 22 of the nozzle 10 is smaller in cross-sectional area than the nozzle hole of the conventional nozzle. The hermetically closed reservoir 72A prevents the solvent contained in the flux f from evaporating.

Figure 19:
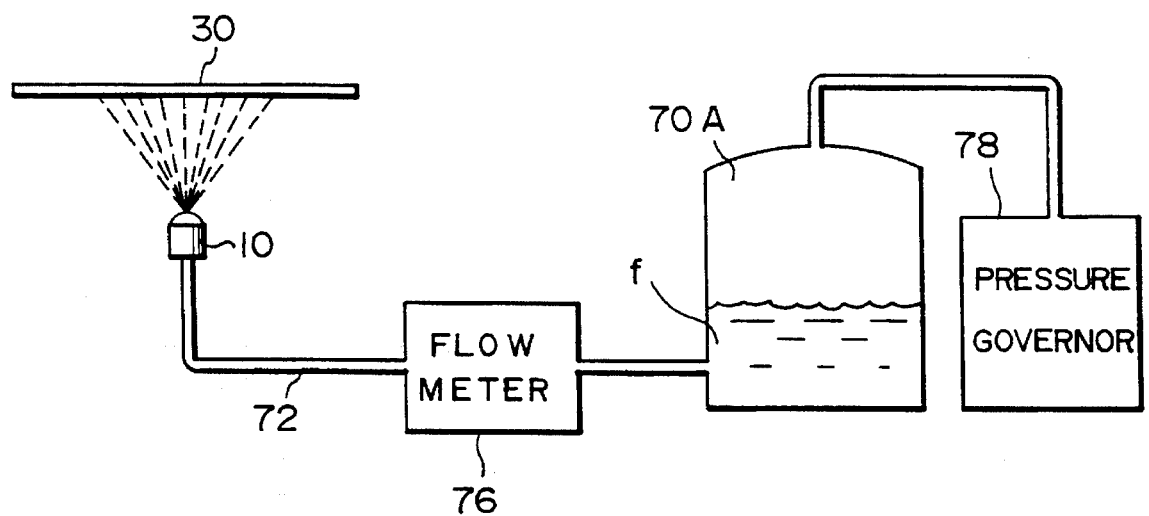

If desired, the embodiments shown in FIGS. 17 and 18 may be combined, as shown in FIG. 19. There are shown in FIG. 19 the flow meter 76, hermetically closed reservoir 70A, and pressure governor 78. In the illustrative embodiment, the control over the amount of spray will become more accurate if the pressure in the reservoir 70A is selected such that the output of the flow meter 76 has a desired value. Specifically, the correlation between the control data of the pressure governor 78 and the amount of spray is determined beforehand, and the control is effected by use of a function graph, etc.

Figure 20:
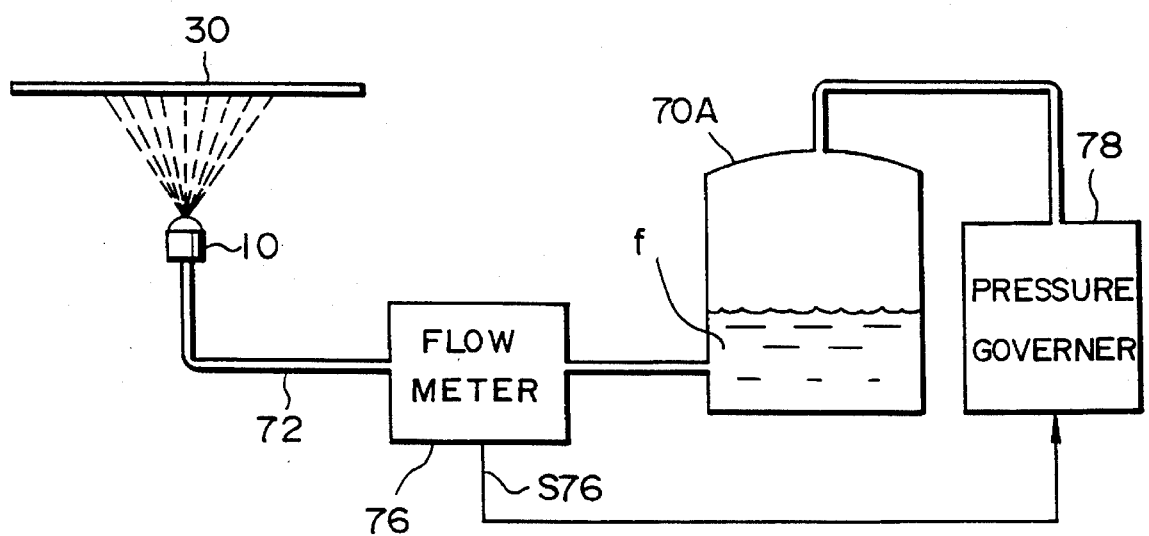

FIG. 20 shows another alternative embodiment of the flux feeding arrangement. In this embodiment, the flux f is fed from the hermetically closed reservoir 70A to the nozzle 10 via the conduit 72 to be sprayed onto the printed circuit board 30. The flow meter 76 is disposed in the conduit 72 for measuring the flow rate of the flux f. The flow rate of the flux f is equal to the amount of spray from the nozzle 10. While the spraying operation is under way, the nozzle hole 22 is fully open and, hence, the amount of spray is controlled only by the pressure acting on the flux f which is in turn dependent on the pressure inside the reservoir 70A. The output signal S76 of the flow meter 76 is fed back to the pressure governor 78. When the actual amount of spray is not equal to a predetermined value, the pressure governor 78 operates automatically in response to the output signal S76 of the flow meter 76 such that the actual amount approaches the predetermined amount. For example, when the effective value of the amount of spray is smaller than the predetermined value, the pressure governor 78 automatically feeds air into the reservoir 70A to thereby compress the flux f. As a result, the amount of spray is immediately increased, and the signal S76 changes accordingly. As soon as the actual amount of spray coincides with the predetermined value, the pressure governor 78 stops compressing the flux f in response to the signal S76. This embodiment, therefore, automatically copes with even dynamic changes in the amount of spray ascribable to temperature variations and aging and which cannot be compensated for by the previous embodiments.

As stated above, in the illustrative embodiment, the flow meter 76 disposed in the conduit 76 quantitatively measures the amount of spray of flux to allow it to be accurately adjusted. The flux is stored in the hermetically closed pressurized reservoir 70A and sprayed from the nozzle 10 in an amount which is adjusted by the pressure inside the tank 70A. As a result, the flux can be sprayed uniformly with no regard to the amount thereof. Further, the output of the flow meter is used to control the pressure inside the reservoir 70A, so that the control automatically follows aging, temperature variations, etc.

Clogging of the nozzle hole 22 of the nozzle 10 will be discussed in relation to the embodiments shown and described.

With the nozzle 10 constructed as shown in FIG. 1, it is impossible to control the feed of the flux f to the flux nozzle 12 and that of air to the air nozzle 16 independently of each other, i.e. the feed of flux and that of air are simply started and stopped at the same time. Therefore, when the spray of flux from the nozzle hole 22 of the nozzle 10 is terminated, the flux is left in the vicinity of the nozzle hole 22 and dried to stop the nozzle hole 22 and air passage 18, obstructing the stable spray of flux f. Since the tip of the nozzle 10 has to be maintained clean by daily maintenance, the operability is low. Further, at the beginning of spraying, the flux f is ejected from the nozzle 10 in comparatively large drops and, therefore, cannot be applied in a uniform distribution, rendering the soldering of the circuit board 10 which follows the spraying unstable.

Figure 21:
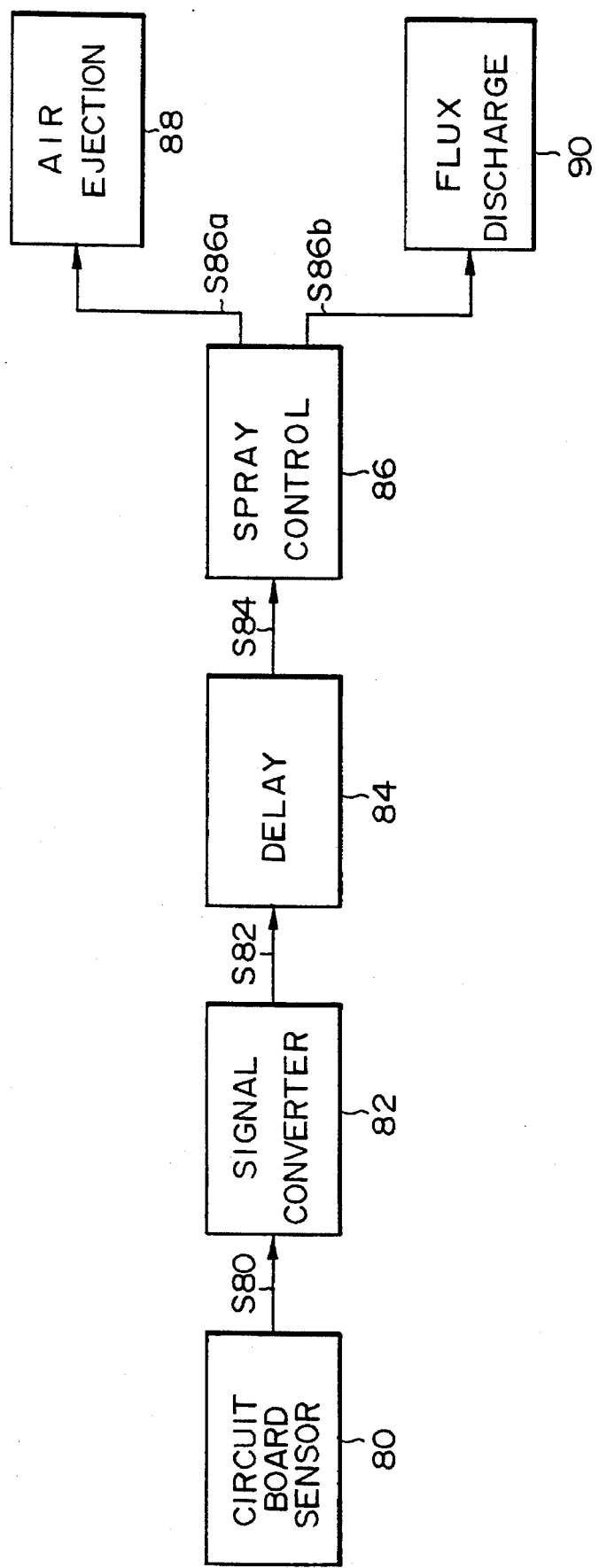
FIG. 21 is a block diagram schematically showing an embodiment of a device for preventing a nozzle from being stopped up in accordance with the present invention.

Referring to FIG. 21, a stop or clog preventing device embodying the present invention is shown which is practicable when the nozzle 10 is affixed to the casing of the flux applying device. As shown, a circuit board sensor 80 has a construction shown in FIG. 10, for example, and produces a signal S80 on sensing a printed circuit board and delivers it to a signal converter 82. In response to the signal S80, the signal converter 82 generates a circuit board presence/absence signal S82 indicative of whether or not the circuit board is present. Since this signal S82 simply shows whether or not the circuit board is present at the position where the sensor 80 is located, it has to be so corrected as to indicate the presence/absence of the circuit board at the position where the nozzle 10 is located. A delay 84 delays the presence/absence signal S82 by a period of time necessary for the circuit to advance from the position of the sensor 80 to the position of the nozzle 10, thereby producing a corrected circuit board presence/absence signal S84 associated with the position of the nozzle 10. A spray control unit 86 is implemented as a CPU, for example, and controls an air ejection section 88 and a flux discharge section 90 by an air supply control signal S88a and a flux supply control signal S86b, respectively. In response, the air ejection section 88 and flux discharge section 90 feed respectively air and flux to the nozzle 10, not shown.

Figure 22:
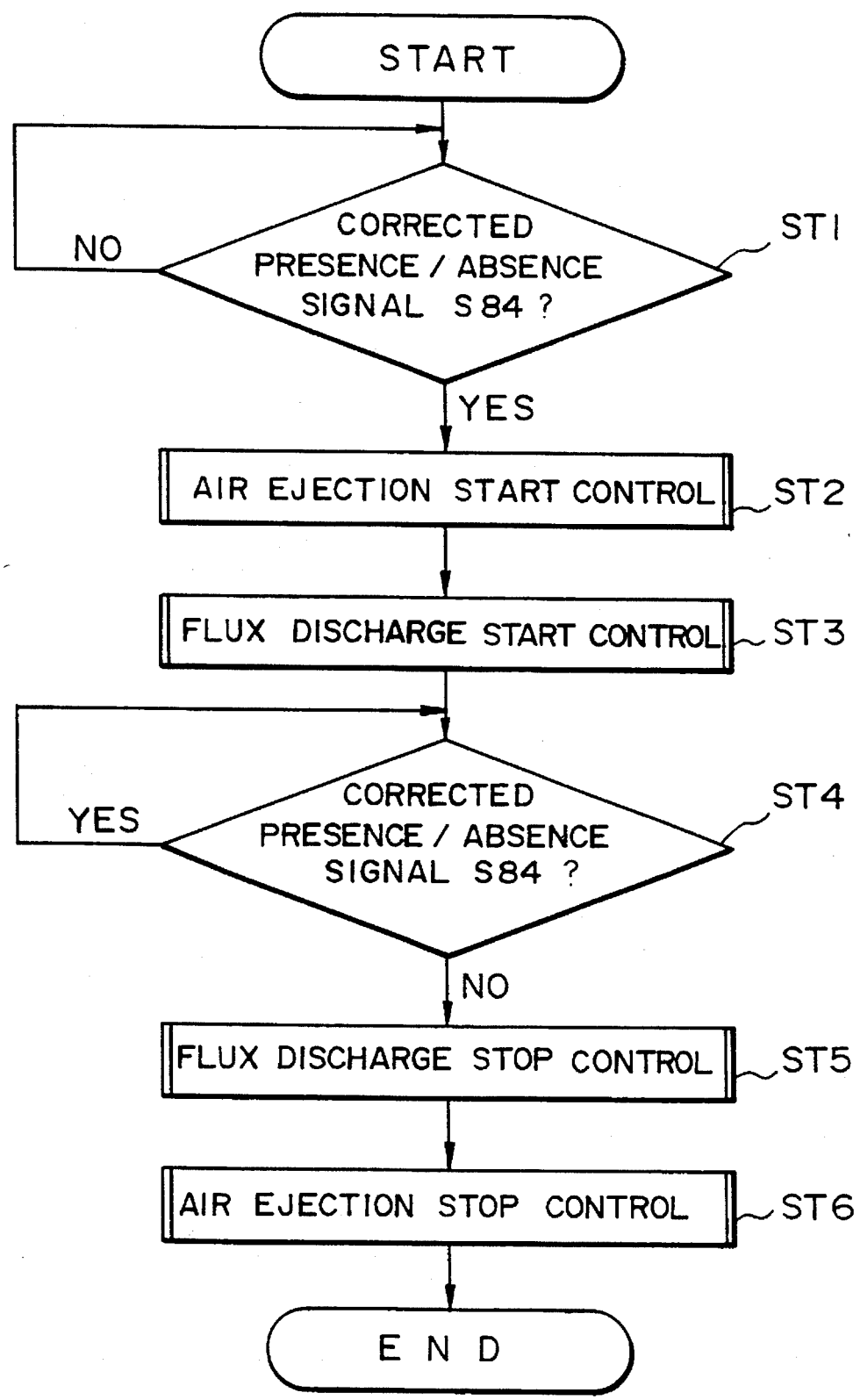
FIG. 22 is a flowchart demonstrating a specific operation of the device shown in FIG. 21.

The operation of the stop preventing device shown in FIG. 21 will be described with reference to FIG. 22 which is representative of a specific sequence of steps to be executed by the spray control unit 86. When the corrected circuit board presence/absence signal S84 is absent, meaning that a printed circuit board does not exist at the position of the nozzle 10, the spray control unit 86 does not execute any control (step ST1). On receiving the corrected presence/absence signal S84, the spray control unit 86 controls the air ejection section 88 by the control signal 86a to cause it to start feeding air to the nozzle 10 (ST2). As a result, air under pressure is fed from a compressor, not shown, to the air passage of the nozzle 10. On the elapse of a predetermined period of time t, the spray control unit 86 controls the flux discharge section 90 by the control signal S86b to cause it to start feeding flux to the nozzle 10 (ST3), i.e. to open the nozzle hole 22 by lowering the needle 20. At this time, the application of the flux to the circuit board begins. Then, the spray control unit 86 determines whether or not the corrected presence/absence signal is still present (ST4). If the answer of the step ST4 is NO, the spray control unit 86 controls the flux discharge section 90 to stop the supply of flux to the nozzle 10 (ST5). On the elapse of the predetermined period of time t, the spray control unit 86 controls the air ejection section 88 to stop the feed of air (ST6). In this manner, at the beginning of spraying, air and flux sequentially start to be fed in this order while, at the end of spraying, the flux and air sequentially stop to be fed in this order. This surely prevents the nozzle 10 from getting clogged. Since the above-mentioned time t needs only be sufficiently short relative to the transport speed of the circuit board, the delay of the start of application of flux due to the time lag t is negligible. Even if the application of flux is slightly irregular at the edge portions of the printed circuit board, the soldering characteristic is not substantially effected since usually parts are not position in such portions. If accurate application is desired even in the edge portions of the circuit board, the delay of the delay 84 may be reduced to advance the timing for starting discharging the flux, and the control for stopping the discharge of the flux to occur after the disappearance of the corrected presence/absence signal S84 may be retarded.

Figure 23:
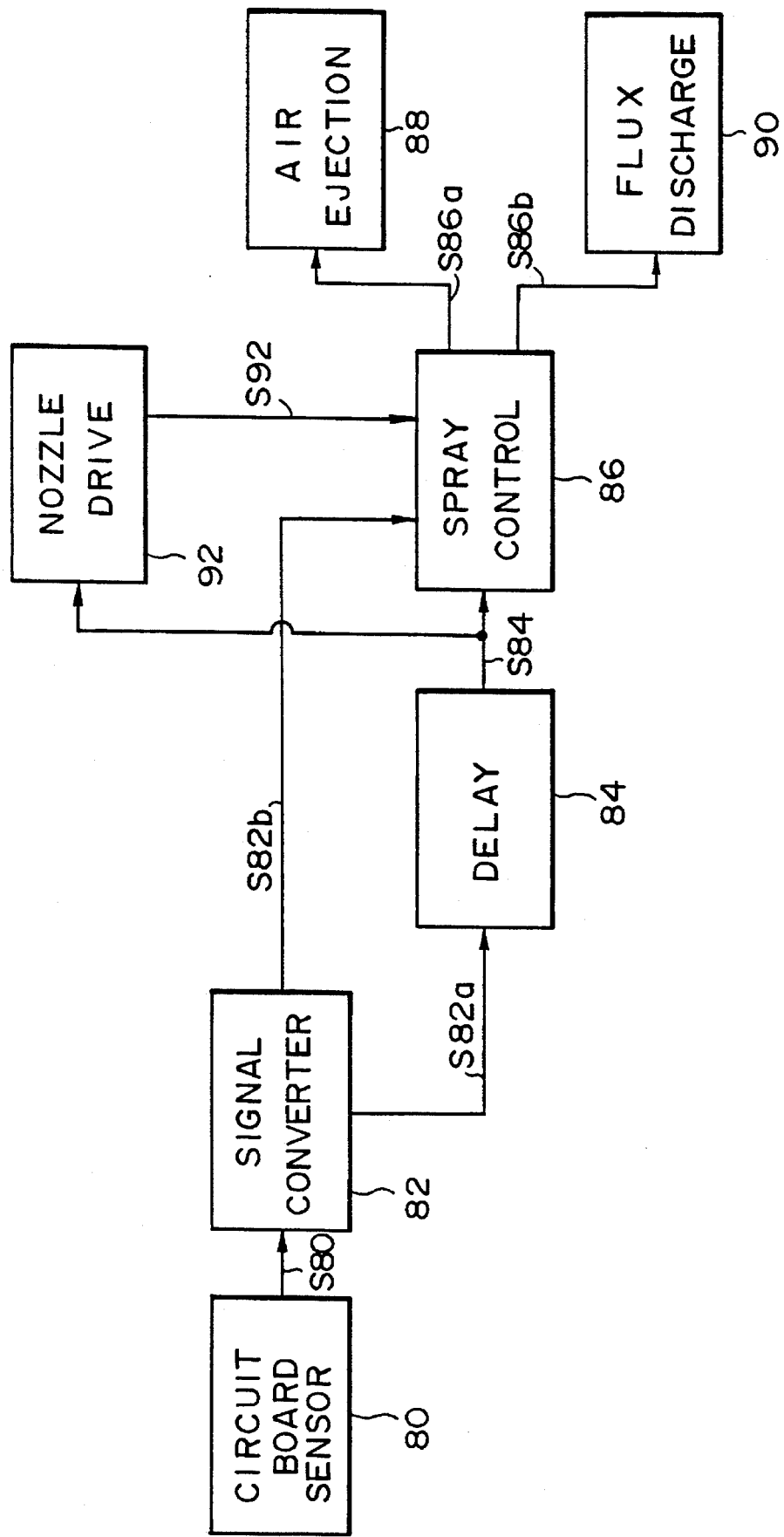
FIG. 23 is a block diagram schematically showing an alternative embodiment of the stop preventing device.

FIG. 23 shows an alternative embodiment of the stop preventing device in accordance with the present invention which is applicable to the flux applying device of the type having a reciprocating nozzle. In FIG. 23, the same blocks as those shown in FIG. 21 are designated by the same reference numerals, and redundant description will be avoided for simplicity. As shown, the signal converter 82 generates, in response to the output S80 of the sensor 80, a circuit board presence/absence signal S82*a* representative of the presence/absence of a circuit board and a width signal S82*b* representative of the width of a circuit board. A nozzle drive 92 is responsive to the corrected presence/absence signal S84 from the delay 84 for controlling the reciprocation of the nozzle 10, not shown, and generates a nozzle position signal S92 representative of the instantaneous position of the nozzle 10. Receiving the three signals S84, S82*b* and S92, the spray control unit 86 generates the control signals S86*a* and S86*b* for controlling the air ejection section 88 and flux discharge section 90, as stated earlier.

Figure 24:
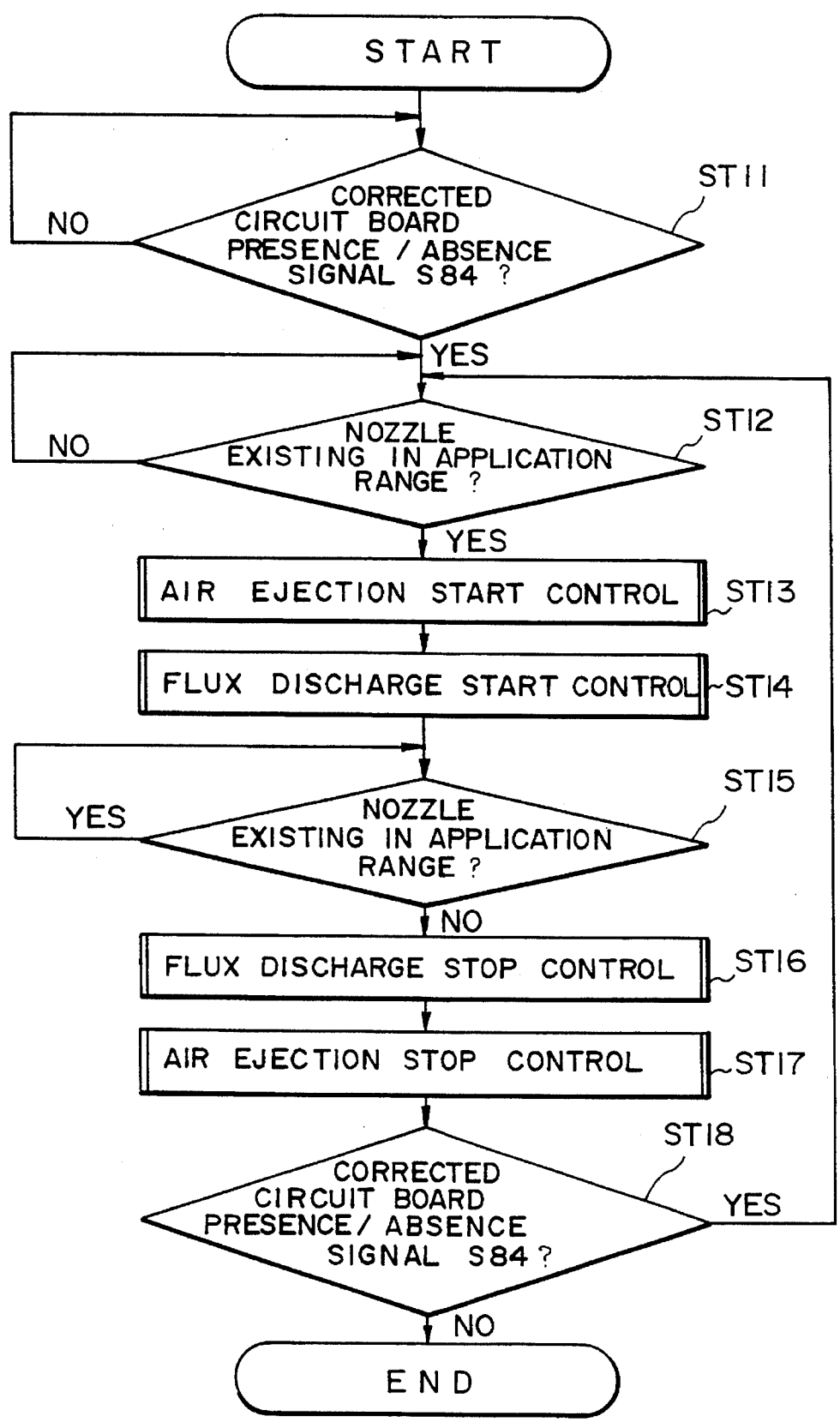
FIG. 24 is a flowchart representative of a specific operation of the device shown in FIG. 23.

FIG. 24 shows a specific operation of the spray control unit 86 shown in FIG. 23. The operation of the embodiment shown in FIG. 23 will be described with reference to FIG. 23. The circuit board sensor 80 generates the detection signal S80, as in the embodiment of FIG. 21. The signal converter 82 generates the presence/absence signal s82*a* and width signal S82*b*, as stated above. Assuming that the circuit board sensor 80 is implemented as a plurality of sensors, FIG. 10, the width of the circuit board can be determined on the basis of the sensors having generated the signal S80 and their locations. Again, the delay 80 delays the presence/absence signal S82*a* to produce the corrected presence/absence signal S84. On receiving the corrected presence/absence signal S84, a nozzle drive 92 causes the nozzle 10 start moving in a reciprocating motion. The nozzle 10 is reciprocatingly movable in, for example, a direction perpendicular to the direction for transporting the circuit board. Further, the nozzle drive 92 generates a nozzle position signal S92 representative of the instantaneous position of the nozzle 10 and feeds it to the spray control unit 86. Receiving the signals S84, S82*b* and S92, the spray control unit 86 controls the feed of air and that of flux, as follows. At the beginning of operation, the spray control unit 86 waits until it receives the corrected presence/absence signal S84 (ST11). On receiving the signal S84, the spray control unit 86 references the signals S92 and S82*b* to see if the nozzle 10 exists in the application range (usually the range where the circuit board is present) (ST12). If the answer of the step ST12 is YES, the spray control unit 86 causes the air ejection section 88 to start feeding air to the nozzle 10 by the control signal S86*a* (ST13). Then, on the lapse of a predetermined period of tim t, the spray control unit 86 causes the flux discharge section 90 to start feeding flux to the nozzle 10 by the control signal S86*b* (ST14). At this instant, the flux begins to be sprayed and applied to the circuit board and is continuously sprayed until the nozzle 10 moves out of the application range (ST15). Then, the spray control unit 86 causes the flux discharge section 90 to stop feeding flux by the control signal S86*b* (ST16). Thereafter, as the period of time t expires again, the spray control unit 86 causes the air ejection section 88 to stop feeding air to the nozzle 10 by the control signal S86*a* (ST17). Subsequently, the spray control unit 86 determines whether or not the corrected presence/absence signal S84 is present (ST18). If the answer of the step ST18 is NO, the spray control unit 86 ends the spraying operation determining that the entire circuit board has passed; if otherwise, it repeats the consecutive steps ST12–ST17. As a result, this embodiment, like the embodiment of FIG. 21, prevents the nozzle 10 from being stopped up. Again, the spray control 86 may be implemented by a CPU.

In summary, the stop preventing device of the present invention controls the discharge of flux and the ejection of air independently by the spray control unit 86 so as to eject each of air and flux at a particular timing. Hence, flux having remained at the tip of the nozzle 10 is blown off at the beginning and end of spraying. This not only prevents the nozzle 10 from setting clogged but also eliminates the need for maintenance.

As stated above, a spray type flux applying device of the present invention remarkably improves the uniformity of flux application, compared to the conventional device. We conducted a series of experiments for making the rinsing of printed circuit boards needless under the following conditions and successfully achieved the purpose.

To eliminate the need for rinsing, use has to be made of flux suitable for such a purpose. Flux consists of a rosin activator and a diluent. Rosin has a weak activating effect and an errosion preventing effect. Halogon and organic acids are specific forms of the activator and serves to enhance solderability. The diluent is added to the flux for the application of rosin and activator and not related to the characteristic of the flux. To free printed circuit boards from rinsing, the flux should preferably have high solderability and low erodibility and have a minimum of residue. These conditions, however, trade off each other. It is necessary, therefore, to use flux whose erodibility due to the activator in the residua is lower than the anti-errosion effect of rosin. Typical of such flux is RF-10M available from NIHON ALMIT CO., LTD (Japan).

Figure 25:
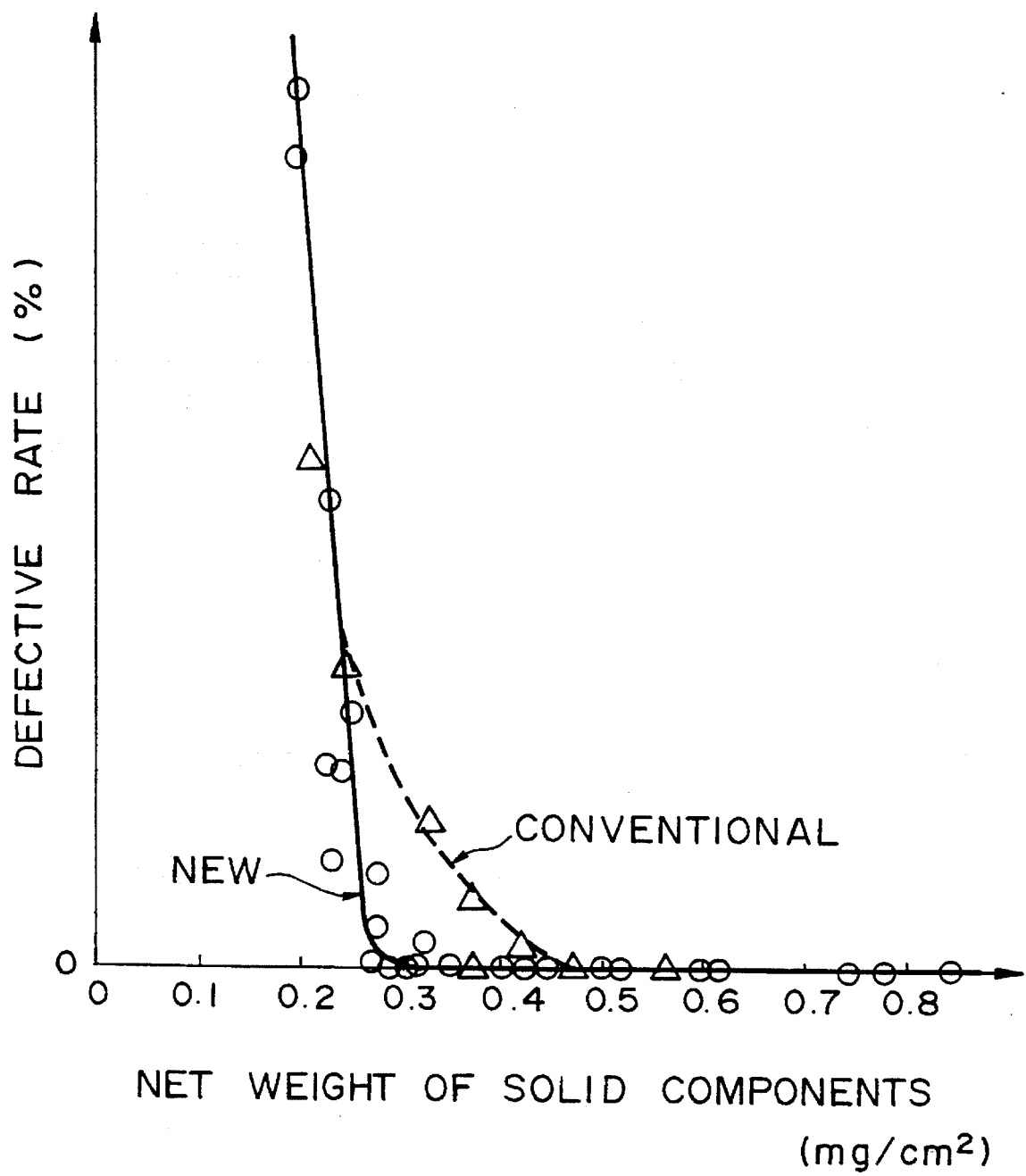
FIG. 25 is a graph showing a relation between solderability and the amount of solid components of flux.

We further determined a relation between the amount of flux applied and the solderability by experiments. As shown in FIG. 25, the experiments showed that solderability equivalent to or even higher than the conventional solderability is achievable if the net weight of solid components is greater than about 0.3 mg/cm$^2$. The amount of residua is substantially equal to the amount of solid components, and the amount of solid components should preferably be small from the inspection and appearance standpoint. Hence, the optimal amount of solid components is 0.3 mg/cm$^2$. A conveyor for transporting circuit boards is generally operable at variable speed, so that the flux applying device has to effect optimal application with no regard to the conveyor speed. The present invention, therefore, determines the reciprocation speed of the nozzle in association with the maximum conveyor speed. Specifically, the present invention moves the nozzle at a speed of 500 mm/sec for a conveyor speed of 0.8 m/min to 1.5 m/min. The nozzle and the printed circuit board are spaced apart by a distance of 200 mm in consideration of the deposition efficiency of flux.

The amount of solid components to be deposited on a circuit board depends on the conveyor speed, the pressure of the pressurized reservoir, and the air pressure of the nozzle. On the other hand, the drop size of flux depends on the air pressure of the nozzle the higher the air pressure, the smaller the drop size is. Preferably, the drop size should be small to promote uniform application and to reduce defective flow-up at the time of soldering. Regarding the nozzle, low-pressure spraying achieves drops comparable with the drops particular to high-pressure spraying at a lower air pressure. When a low-pressure nozzle AGB-10 available from Asahi Okuma Industrial Co., Ltd. (Japan) is used by way of example, drops of flux whose diameter is about 0.1 mm to 0.04 mm are deposited on a circuit board at an air pressure of 1.0 kgf/cm$^2$ to 2.0 kgf/cm$^2$ and with the uniform application substantially not changed (about 100 mm). Assuming that the air pressure lies in such a range and that the conveyor speed is 1.2 m/min, then the amount of solid components of 0.3 mg/cm$^2$ is achievable if the pressure inside the reservoir is controlled to 0.22 kgf/cm$^2$ (in the case of both-way application) or 0.35 kgf/cm$^2$ to 0.60 kgf/cm$^2$ (in the case of one-way application). Further if the air pressure and the conveyor speed are constant, the amount of solid components can be controlled by changing the pressure inside the reservoir.

Experiments proved that the flux applying device of the present invention is six times higher than the conventional fixed-nozzle type device in the uniformity of flux application and twelve times higher than the same in the stability of discharge against the change in the amount of flux in the reservoir. The minimum necessary amount of application which is 0.3 mg/cm$^2$ as mentioned above is about one-fifth of the conventional amount, and the thickness is not more than about 3 μm. Hence, the resultant circuit boards have no problems in the appearance and inspection aspect even if they are not rinsed with fron.

Flux other than RF-10M mentioned above are also reliable if they are RMA type flux.

Various modifications will become possible for those skilled in the art after receiving the teachings of the present disclosure without departing from the scope thereof.

What is claimed is:

1. A device for spraying flux onto an object being transported in a first direction by transporting means, said device comprising:

a nozzle located in a spraying position spaced from the object for spraying the flux in a second direction toward said object while the object is being transported in said first direction, said nozzle being the only nozzle in said device, said nozzle being operative to emit the flux in a beam that impinges upon said object to form an effective application area of flux that has an oval shape having a major axis that extends in said first direction;

nozzle driving means for moving said nozzle with a reciprocating side to side motion in a straight path that is perpendicular to said first direction and for causing said effective application area to reciprocate with a side to side motion in a straight path that is perpendicular to said first direction;

said second direction being transverse to both said straight path and said first direction;

said nozzle driving means moving said nozzle at a speed that is sufficiently greater than a speed of movement of said object in said first direction to cause said effective application area to traverse a side to side zig-zag path relative to said object and said transporting means, so that overlapping layers of said flux are sprayed on said object;

said side to side zig-zag path comprising a plurality of equal length straight segments transverse to said first direction and of equal length, said segments being connected end to end at points of reversal, with a first group of said points of reversal being equally spaced and positioned in a first row and a second group of said points of reversal being equally spaced and positioned in a second row extending in said first direction, a first group of said segments being parallel to each other and a second group of said segments being parallel to each other while being inclined with respect to said first group of said segments; and said oval shape being of a dimension along said major axis that is substantially greater than a distance between adjacent points of reversal in each of said first group and second group of points of reversal.

2. A device as claimed in claim 1, wherein said nozzle driving means comprises a guide which supports said nozzle in such a manner as to allow said nozzle to move in said path in said spraying position.

3. A device as claimed in claim 1, further comprising object sensing means for sensing a length of the object in transport with respect to said straight path and determining whether said object is located at a flux application position in which the flux sprayed by said nozzle is applied to said object, said object sensing means outputting a detection signal when said object sensing means senses that said object is located at said flux application position.

4. A device as claimed in claim 3, wherein said object sensing means comprises transmission type optical sensor means located in a position upstream of and spaced apart from said spraying position by a predetermined distance and in a plane perpendicular and vertical to said first direction.

5. A device as claimed in claim 4, wherein said optical sensor means comprises a plurality of pairs of light emitting elements and light-sensitive elements arranged in said plane to face each other so that said object is located between said light emitting elements and said light-sensitive elements when the object is being transported in the first direction.

6. A device as claimed in claim 3, further comprising control means for controlling, in response to said object sensing means outputting said detection signal representative of the presence of the object, said nozzle and said nozzle driving means such that a range in which said nozzle is movable in a reciprocating motion in said straight path is set.

7. A device as claimed in claim 3, further comprising control means for controlling, in response to said object sensing means outputting said detection signal representative of the location of the object, said nozzle and said nozzle driving means such that a spray zone and a non-spray zone of said nozzle in said straight path are set.

8. A device as claimed in claim 3, further comprising:

air feeding means for feeding air to said nozzle;

flux feeding means for feeding the flux to said nozzle; and control means for controlling, in response to the object sensing means outputting said detection signal, said air feeding means and said flux feeding means such that the feed of air and the feed of flux each occurs at a particular timing.

9. A device as claimed in claim 8, wherein said control means generates air feed control signals and flux feed control signals each at particular timings such that:

a first air feed control signal for starting feeding of air to said nozzle is output by said control means when a first predetermined period of time has elapsed after said object sensing means has output said detection signal;

a first flux feed control signal for starting feeding of the flux to said nozzle is output by said control means after a second predetermined period of time has elapsed after said first predetermined period of time;

a second flux feed control signal for stopping feeding of the flux to said nozzle is output by said control means when a third predetermined period of time has elapsed after the object sensing means has failed to output said detection signal; and a second air feed control signal for stopping feeding of air is output by said control means after a fourth predetermined period of time has elapsed after said third predetermined period of time.

10. A device as claimed in claim 1, further comprising flux feeding means for feeding the flux to said nozzle.

11. A device as claimed in claim 10, wherein said flux feeding means comprises a reservoir storing the flux therein, a conduit for feeding said flux to said nozzle, and measuring means disposed in said conduit for measuring the flow rate of said flux.

12. A device as claimed in claim 11, wherein said reservoir comprises a hermetically closed pressurized reservoir, and wherein said flux feeding means further comprises pressure governing means for maintaining pressure in said reservoir at a predetermined pressure in response to an output signal of said measuring means.

13. A device as claimed in claim 10, wherein said flux feeding means comprises a hermetically closed pressurized reservoir, a conduit for feeding the flux from said reservoir to said nozzle, and pressure governing means for maintaining pressure in said reservoir at a predetermined pressure.

14. A device as claimed in claim 1 further comprising:

object sensing means for sensing a length of the object in transport with respect to a direction perpendicular to said first direction and determining whether said object is present in a flux application position in which the flux sprayed by said nozzle is applied to said object, said object sensing means outputting a detection signal when said object sensing means senses that said object is located at said flux application position;

air feeding means for feeding air to said nozzle;

flux feeding means for feeding the flux to said nozzle; and control means for controlling, in response to said detection signal being output by said object sensing means, said air feeding means and said flux feeding means such that the feed of air and the feed of flux to said nozzle each occurs at a particular timing;

said control means generating air feed control signals and flux feed control signals each at particular timings such that;

a first air feed control signal for starting feeding air to said nozzle is output by said control means when a first predetermined period of time has elapsed after the object sensing means has output said detection signal;

a first flux feed control signal for starting feeding of the flux to said nozzle is output when a second predetermined period of time has elapsed after said first predetermined period of time;

a second flux feed control signal for stopping feeding of the flux to said nozzle is output by said control means when a third predetermined period of time has elapsed after the the object sensing means has failed to output said detection signal; and a second air feed control signal for stopping feeding of air is output by said control means when a fourth predetermined period of time has elapsed after said third predetermined period of time.

15. A device as claimed in claim 1 in which said nozzle and nozzle driving means cooperate so that most of said effective application area is positioned beyond said object that is being sprayed when said nozzle is at its end positions along said path.

16. A device as claimed in claim 1 in which said nozzle and nozzle driving means cooperate so that substantially all of said effective application area is positioned beyond said object that is being sprayed when said nozzle is at its end positions along said path.

17. A device as claimed in claim 1 in which said oval shape of said effective application area has a dimension along its minor axis that is substantially shorter than said path along which said nozzle reciprocates.

18. A device as claimed in claim 1 in which said nozzle driving means moves said nozzles along said path at a speed that is approximately eight times the speed at which said object moves in said first direction.

19. A device as claimed in claim 1 in which said nozzle driving means moves said nozzle along said path at a speed of approximately 500 mm/sec.

* * * * *